(12) United States Patent
Lee et al.

(10) Patent No.: US 7,172,913 B2
(45) Date of Patent: Feb. 6, 2007

(54) THIN FILM TRANSISTOR ARRAY PANEL AND MANUFACTURING METHOD THEREOF

(75) Inventors: Woo-Geun Lee, Yongin-si (KR); Beom-Seok Cho, Seoul (KR); Je-Hun Lee, Seoul (KR); Chang-Oh Jeong, Suwon-si (KR); Sang-Gab Kim, Seoul (KR); Min-Seok Oh, Yongin-si (KR); Young-Wook Lee, Suwon-si (KR); Hee-Hwan Choe, Incheon-si (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 11/082,967

(22) Filed: Mar. 18, 2005

(65) Prior Publication Data

US 2005/0221546 A1  Oct. 6, 2005

(30) Foreign Application Priority Data

Mar. 19, 2004  (KR) ............... 10-2004-0018805
Aug. 13, 2004  (KR) ............... 10-2004-0064021

(51) Int. Cl.
*H01L 21/00* (2006.01)

(52) U.S. Cl. ............... 438/30; 438/34; 438/149; 438/151; 438/158

(58) Field of Classification Search ............... 438/30, 438/34, 149, 151, 158
See application file for complete search history.

(56) References Cited

U.S. PATENT DOCUMENTS

| | | | | |
|---|---|---|---|---|
| 2002/0021403 A1* | 2/2002 | Kim et al. | ............... | 349/187 |
| 2003/0133067 A1* | 7/2003 | Park et al. | ............... | 349/141 |
| 2004/0105067 A1* | 6/2004 | Kim et al. | ............... | 349/187 |
| 2005/0140888 A1* | 6/2005 | Kwon | ............... | 349/139 |

* cited by examiner

*Primary Examiner*—Zandra V. Smith
*Assistant Examiner*—Bac H. Au
(74) *Attorney, Agent, or Firm*—F. Chau & Associates LLC

(57) ABSTRACT

A method of manufacturing a thin film transistor array panel including forming a gate line on a substrate, forming a gate insulating layer on the gate line, forming a semiconductor layer on the gate insulating layer, forming a data line and a drain electrode on the semiconductor layer, depositing a passivation layer on the data line and the drain electrode, forming a photoresist including a first portion and a second portion, which is thinner than the first portion, on the passivation layer, etching the passivation layer using the photoresist as a mask to expose a portion of the drain electrode, removing the second portion of the photoresist, depositing a conductive film, and removing the first portion of the photoresist to form a pixel electrode on the exposed portion of the drain electrode.

20 Claims, 38 Drawing Sheets

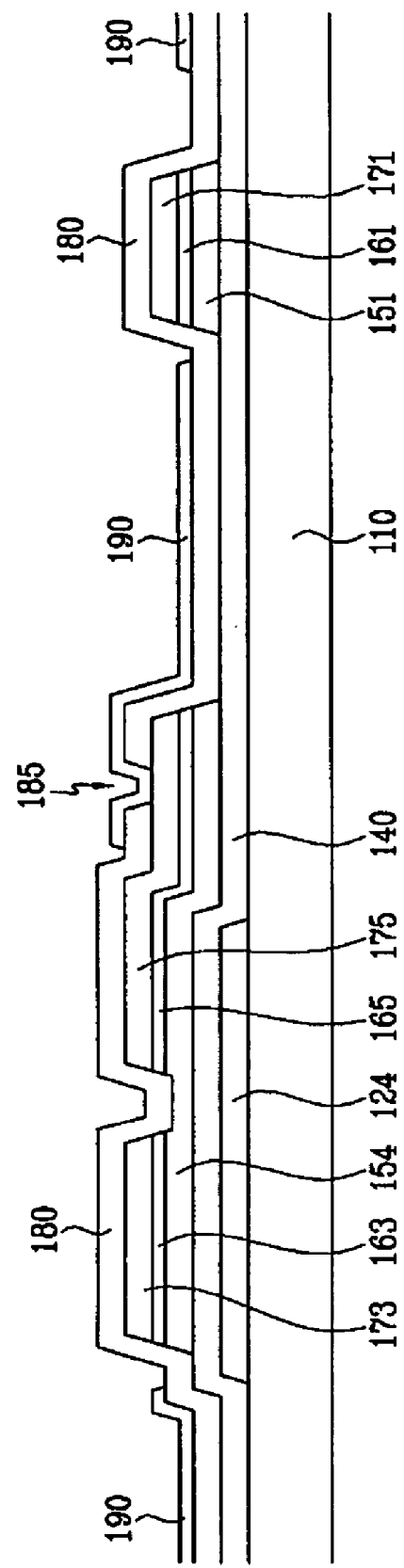

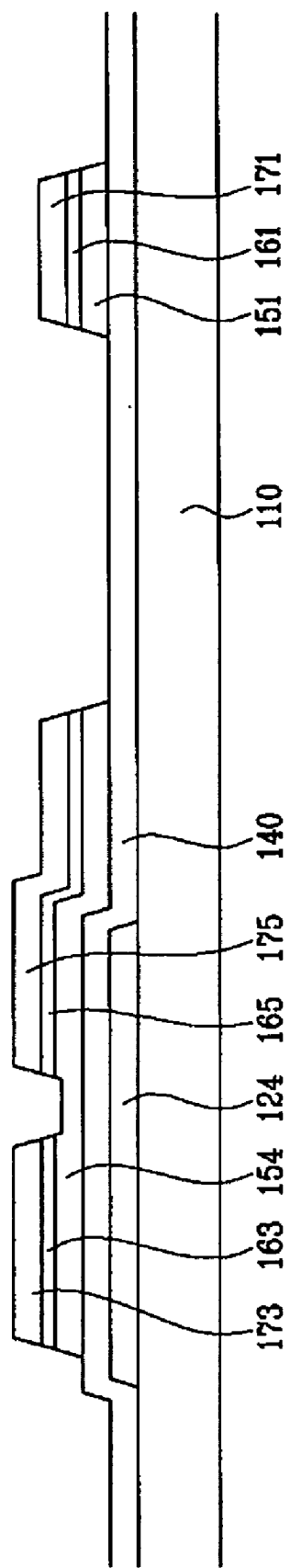

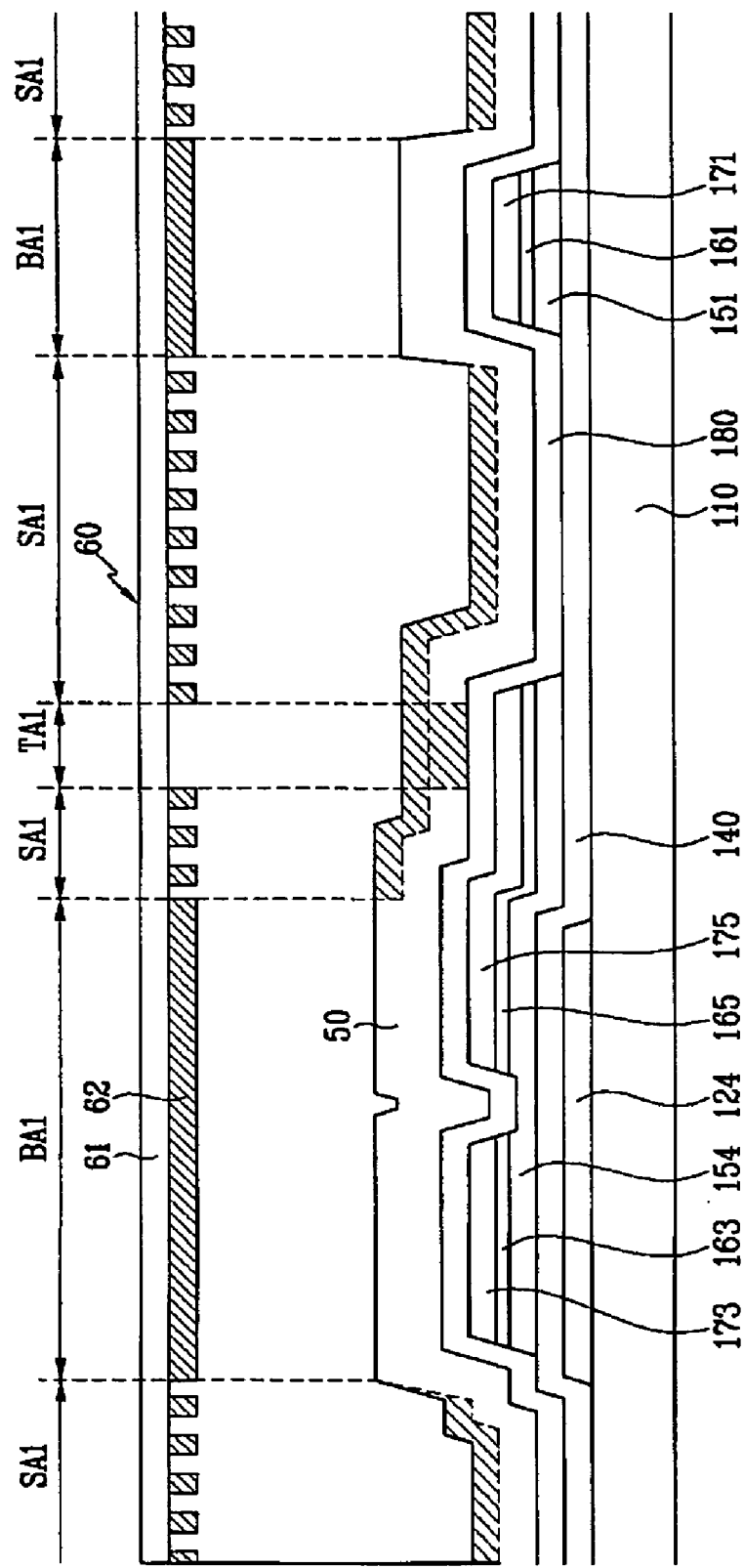

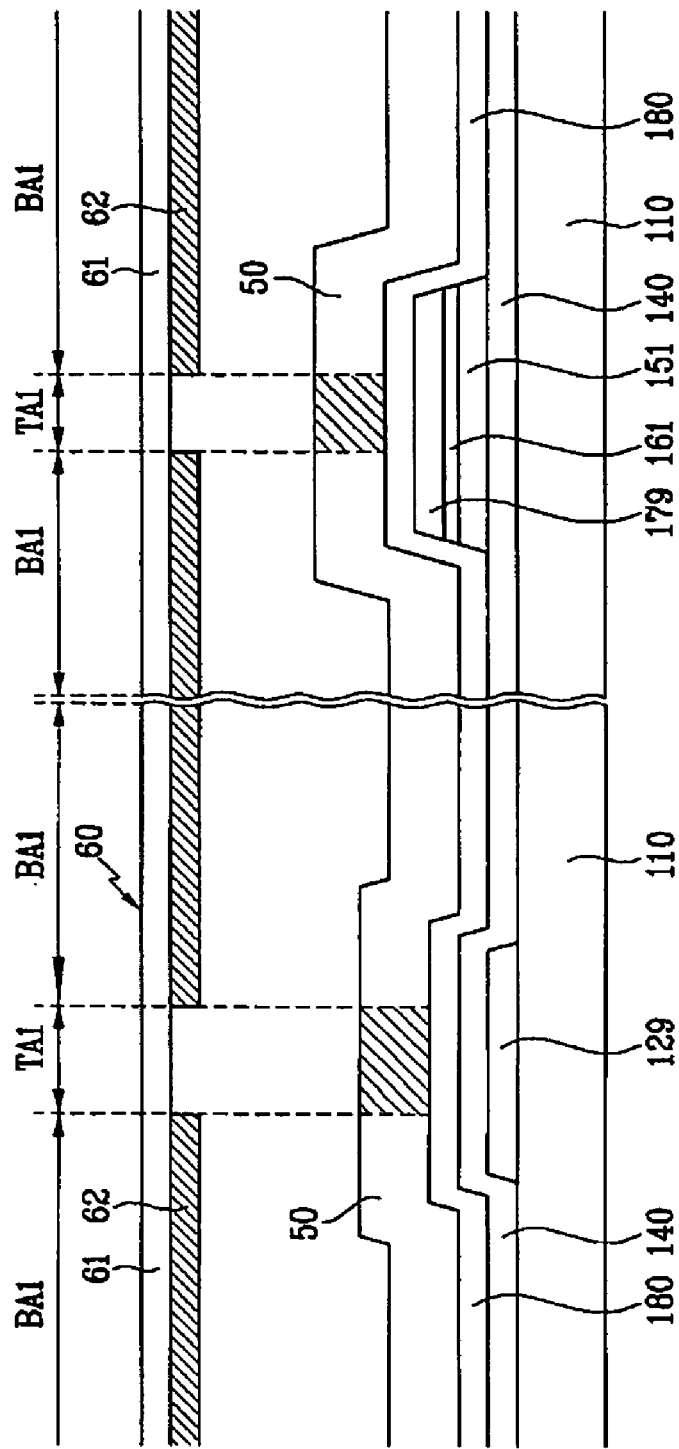

FIG.19B
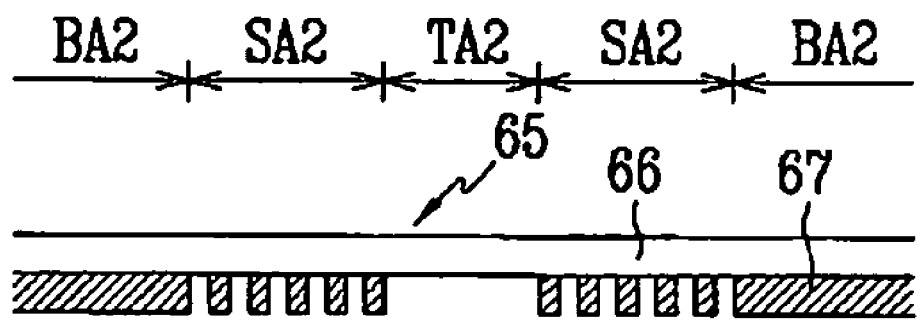
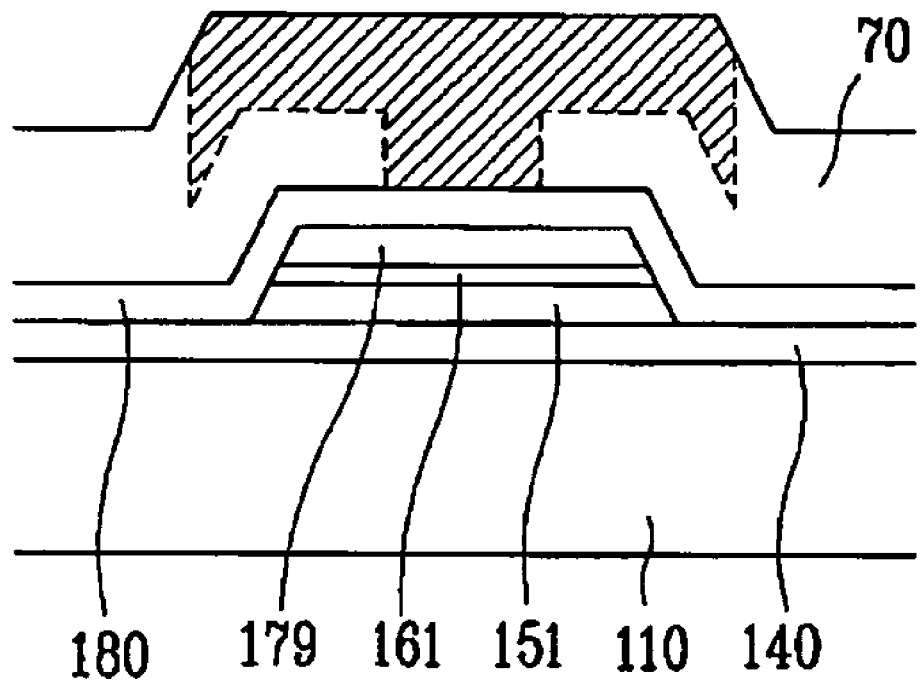

THIN FILM TRANSISTOR ARRAY PANEL AND MANUFACTURING METHOD THEREOF

CROSS REFERENCE TO RELATED APPLICATION

This application claims priority to and the benefit of Korean Patent Application No. 10-2004-0018805, filed on Mar. 19, 2004, and Korean Patent Application No. 10-2004-0064021, filed on Aug. 13, 2004, which are hereby incorporated by reference for all purposes as if fully set forth herein.

BACKGROUND OF THE INVENTION

1. Field of the Invention

The present invention relates to a thin film transistor array panel and a manufacturing method thereof.

2. Discussion of the Background

Generally, an active matrix type display device, such as a liquid crystal display (LCD) and an organic light emitting display (OLED), includes a plurality of pixels arranged in a matrix where each pixel includes a field generating electrode and a switching element. The switching element may include a thin film transistor (TFT) having a gate, source and drain. Each pixel's TFT selectively transmits data signals to the field-generating electrode in response to gate signals.

The display device further includes a plurality of signal lines for transmitting signals to the switching elements. The signal lines include gate lines transmitting gate signals and data lines transmitting data signals.

The LCD and the OLED may include a panel, often referred to as a TFT array panel, having the TFTs, the field-generating electrodes, and the signal lines.

The TFT array panel may have a layered structure that includes several conductive and insulating layers. The gate lines, the data lines, and the field-generating electrodes may be formed of different conductive layers that are separated by insulating layers.

The TFT array panel having the layered structure is manufactured by several lithography and etching steps. However, it is desirable to manufacture the TFT array panel using a minimum number of lithography steps because they are costly and time consuming.

SUMMARY OF THE INVENTION

The present invention provides a TFT array panel that may be made faster and at less cost.

Additional features of the invention will be set forth in the description which follows, and in part will be apparent from the description, or may be learned by practice of the invention.

The present invention discloses a method for manufacturing a thin film transistor array panel comprising forming a gate line on a substrate, forming a gate insulating layer on the gate line, forming a semiconductor layer on the gate insulating layer, forming a data line and a drain electrode on the semiconductor layer, depositing a passivation layer on the data line and the drain electrode, forming a photoresist on the passivation layer and including a first portion and a second portion, which is thinner than the first portion, etching the passivation layer using the photoresist as a mask to expose a portion of the drain electrode, removing the second portion of the photoresist, depositing a conductive film to form a pixel electrode, and removing the first portion of the photoresist.

The present invention also discloses a method for manufacturing a thin film transistor array panel comprising forming a gate line on a substrate, forming a gate insulating layer on the gate line, forming a semiconductor layer on the gate insulating layer, forming a data line and a drain electrode on the semiconductor layer, depositing a passivation layer on the data line and the drain electrode, forming a photoresist on the passivation layer and including a first portion and a second portion, which is thinner than the first portion, etching a layer using the photoresist as a mask to expose a portion of the data line or a portion of the gate line, removing the second portion of the photoresist, depositing a conductive film to form a contact assistant on the exposed portion of the data line or on the exposed portion of the gate line, and removing the first portion of the photoresist.

The present invention also discloses a method for manufacturing a thin film transistor array panel comprising forming a gate line on a substrate, forming a gate insulating layer on the gate line, forming a semiconductor layer on the gate insulating layer, forming a data line and a drain electrode on the semiconductor layer, depositing a passivation layer on the data line and the drain electrode, forming a first photoresist, etching the passivation layer using the is first photoresist as a mask to form a first contact hole exposing a portion of the drain electrode and to expose a portion of the gate insulating layer on a portion of the gate line, transforming the first photoresist into a second photoresist, etching the passivation layer and the gate insulating layer using the second photoresist as a mask to form a second contact hole and a third contact hole exposing a portion of the gate line and a portion of the data line, respectively, depositing a conductive film to form a pixel electrode, and removing the second photoresist.

The present invention also discloses a thin film transistor array panel comprising a gate line formed on a substrate, a gate insulating layer formed on the gate line, a semiconductor layer formed on the gate insulating layer, a first ohmic contact and a second ohmic contact formed on the semiconductor layer, a data line formed on the first ohmic contact and a drain electrode formed on the second ohmic contact, a passivation layer formed on the data line and the drain electrode and having a first contact hole exposing a portion of the drain electrode and a second contact hole exposing a portion of the data line, a pixel electrode formed on the passivation layer and coupled with the drain electrode through the first contact hole, and a first contact assistant formed on the exposed portion of the data line and having edges substantially coinciding with edges of the second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2A is a sectional view of the TFT array panel taken along line IIA–IIA' of FIG. 1.

FIG. 7A and FIG. 8A are sectional views of the TFT array panel taken along line VIIA–VIIA' of FIG. 6.

FIG. 7B and FIG. 8B are sectional views of the TFT array panel taken along lines VIIB–VIIB' and VIIB'–VIIB" of FIG. 6.

FIG. 18B and FIG. 19B are sectional views of the TFT array panel taken along line XVIIIB–XVIIIB' of FIG. 17.

DETAILED DESCRIPTION OF EMBODIMENTS

Figure 1:
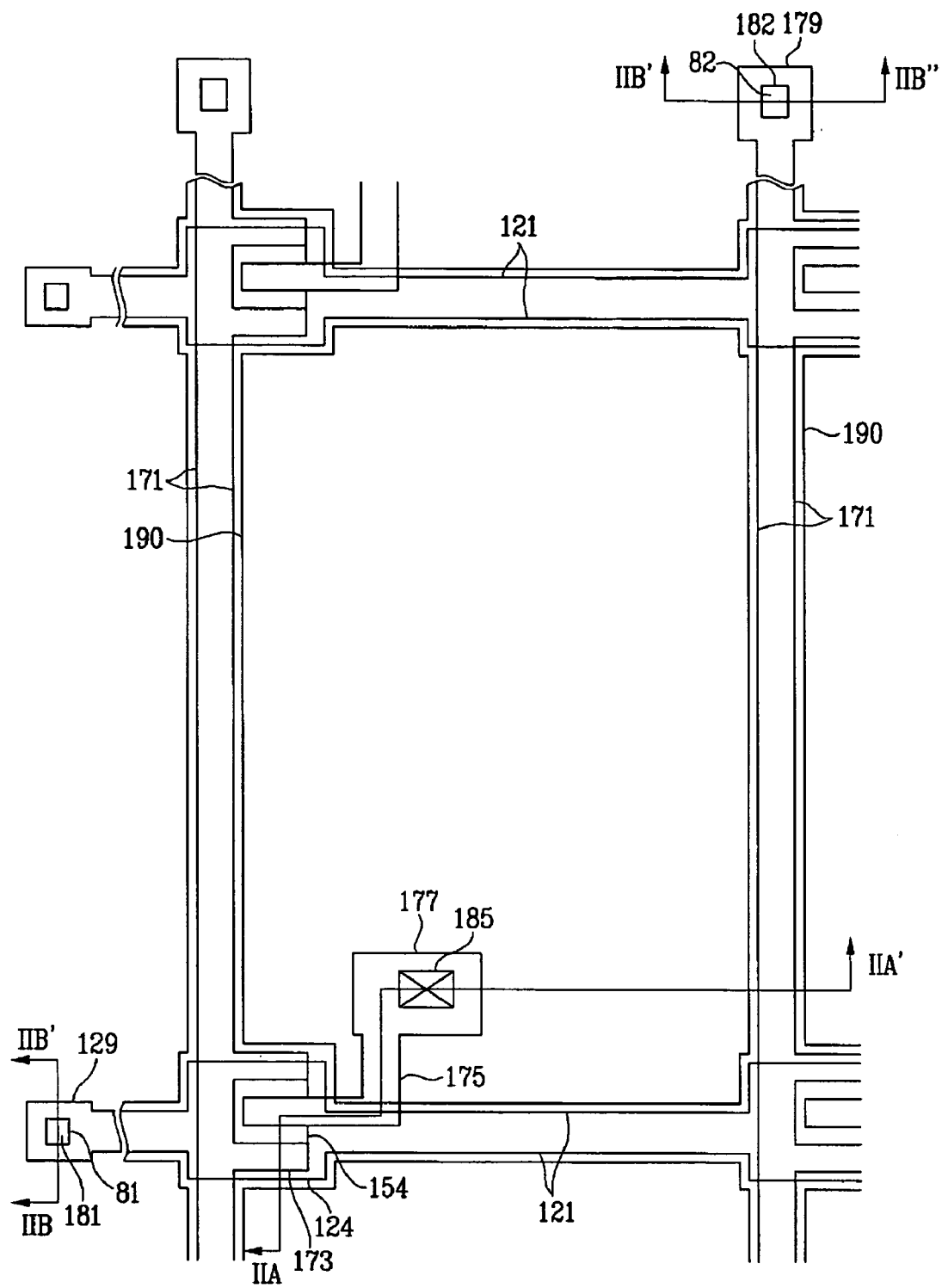
FIG. 1 is a plan view showing a TFT array panel according to an exemplary embodiment of the present invention.

The present invention now will be described more fully hereinafter with reference to the accompanying drawings showing exemplary embodiments of the invention. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Additionally, the terms remove, removed, and removing do not necessarily mean all traces of the subject have been totally eliminated.

A TFT array panel according to an exemplary embodiment of the present invention will be described in detail with reference to FIG. 1, FIG. 2A and FIG. 2B.

Figure 2B:
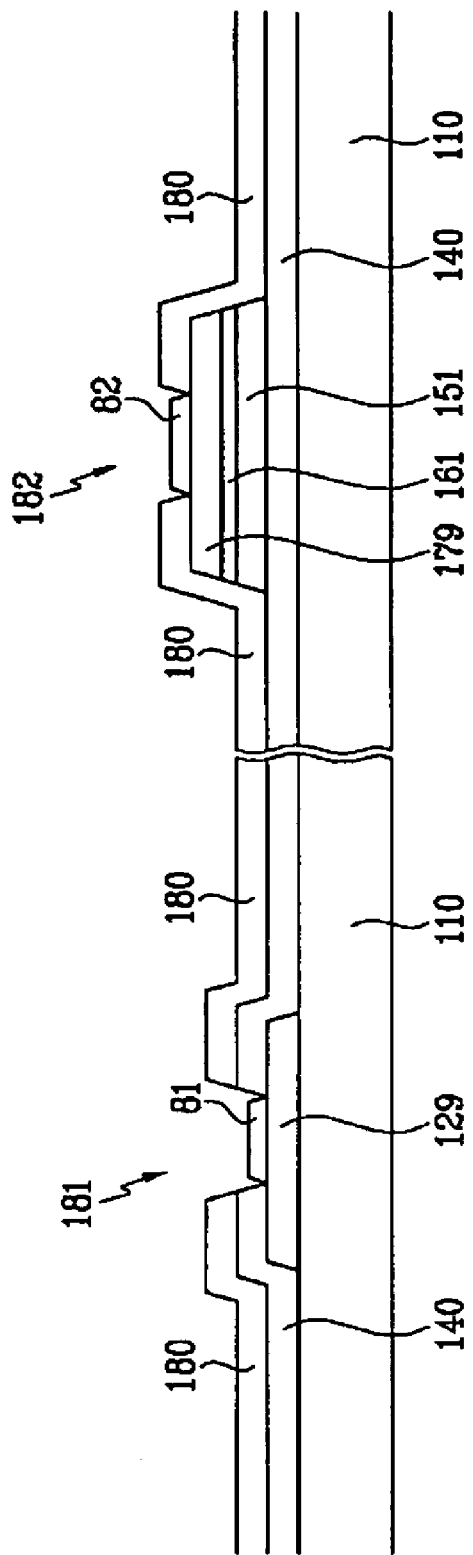
FIG. 2B is a sectional view of the TFT array panel taken along lines IIB–IIB' and IIB'–IIB" of FIG. 1.

FIG. 1 is a plan view of a TFT array panel according to an exemplary embodiment of the present invention, FIG. 2A is a sectional view of the TFT array panel taken along line IIA–IIA' of FIG. 1, and FIG. 2B is a sectional view of the TFT array panel taken along lines IIB–IIB' and IIB'–IIB" of FIG. 1.

A plurality of gate lines 121 may be formed on an insulating substrate 110, which may be formed of transparent glass or other like materials.

The gate lines 121, which extend substantially in a transverse direction, transmit gate signals. Each gate line 121 includes a plurality of gate electrodes 124 projecting upward and downward and an end portion 129, which may have a large area where it may be coupled with another layer or a driving circuit. The gate lines 121 may extend to be coupled with a driving circuit that may be integrated on the TFT array panel.

The gate lines 121 may be made of Al containing metal, such as Al and Al alloy, Ag containing metal, such as Ag and Ag alloy, Cu containing metal, such as Cu and Cu alloy, Mo containing metal, such as Mo and Mo alloy, Cr, Ti, Ta or other like materials. The gate lines 121 may have a multi-layered structure including two films having different physical characteristics. One of the films may be made of low resistivity metal including Al containing metal, Ag containing metal, and Cu containing metal for reducing a signal delay or voltage drop in the gate lines 121. The other film may be made of material such as Mo containing metal, Cr, Ta or Ti, which may have good physical, chemical, and electrical contact characteristics with other materials such as indium tin oxide (ITO) or indium zinc oxide (IZO). For example, a lower Cr film and an upper Al (alloy) film or a lower Al (alloy) film and an upper Mo (alloy) film may be used for the two films. However, they may be made of various metals or conductors.

The lateral sides of the gate lines 121 may be inclined relative to a surface of the substrate at an inclination angle of about 30–80 degrees.

A gate insulating layer 140, which may be made of silicon nitride (SiNx), may be formed on the gate lines 121.

A plurality of semiconductor stripes 151, which may be made of hydrogenated amorphous silicon (abbreviated to "a-Si") or polysilicon, may be formed on the gate insulating layer 140. Each semiconductor stripe 151 extends substantially in a longitudinal direction and has a plurality of projections 154 that are branched out toward the gate electrodes 124.

A plurality of ohmic contact stripes and islands 161 and 165, which may be made of silicide or n+ hydrogenated a-Si heavily doped with an n-type impurity such as phosphorous, may be formed on the semiconductor stripes 151. Each ohmic contact stripe 161 has a plurality of projections 163, and the projections 163 and the ohmic contact islands 165 may be located in pairs on the projections 154 of the semiconductor stripes 151.

The lateral sides of the semiconductor stripes 151 and the ohmic contacts 161 and 165 may be inclined relative to a surface of the substrate at inclination angles of about 30–80 degrees.

A plurality of data lines 171 and a plurality of drain electrodes 175, which may be separate from the data lines 171, may be formed on the ohmic contacts 161 and 165, respectively.

The data lines 171, which extend substantially in the longitudinal direction, transmit data voltages and intersect the gate lines 121. Each data line 171 includes an end portion 179, having a large area for coupling with another layer or an external device, and a plurality of source electrodes 173 projected toward the gate electrodes 124.

Each drain electrode 175 has a wide end portion 177 and a linear end portion. The wide end portion 177 has a large area for coupling with another layer, and the linear end is portion may be partly enclosed by a source electrode 173, which may be curved.

A gate electrode 124, a source electrode 173, and a drain electrode 175, along with a projection 154 of a semiconductor stripe 151, form a TFT having a channel formed in the projection 154 disposed between the source electrode and the drain electrode.

The data lines 171 and the drain electrodes 175 may be made of refractory metal, such as Cr, Mo, Ti, Ta or alloys thereof. However, they may have a multi-layered structure including a refractory metal film (not shown) and a low resistivity film (not shown). For example, the multi-layered structure may comprise a double-layered structure including a lower Cr/Mo (alloy) film and an upper Al (alloy) film or a triple-layered structure of a lower Mo (alloy) film, an intermediate Al (alloy) film, and an upper Mo (alloy) film.

Like the gate lines 121, the data lines 171 and the drain electrodes 175 may have inclined edge profiles with inclination angles at about 30–80 degrees.

The ohmic contacts 161 and 165 may be interposed between the underlying semiconductor stripes 151 and the overlying conductors 171 and 175, respectively, to reduce the contact resistance therebetween. The semiconductor stripes 151 have similar planar shapes as the data lines 171 and the drain electrodes 175, as well as the underlying ohmic contacts 161 and 165. However, the projections 154 of the semiconductor stripes 151 may include some exposed portions, which are not covered with the data lines 171 and the drain electrodes 175, such as portions located between the source electrodes 173 and the drain electrodes 175. Alternatively, only the projections 154 may remain to form islands without other portions of the semiconductor stripes 151.

A passivation layer 180 may be formed on the data lines 171, the drain electrodes 175, the exposed portions of the projections 154 of the semiconductor stripes 151, and the source electrodes 173. The passivation layer 180 may be made of an inorganic insulator such as silicon nitride or silicon oxide, a photosensitive organic material having a good flatness characteristic, or a low dielectric insulating material having a dielectric constant less than 4.0, such as a-Si:C:O and a-Si:O:F, which may be formed by plasma enhanced chemical vapor deposition (PECVD). The passivation layer 180 may have a double-layered structure including a lower inorganic film and an upper organic film so that it has the advantage of the organic film while protecting the exposed portions of the projections 154 of the semiconductor stripes 151.

The passivation layer 180 may have a plurality of contact holes 182 and 185 exposing a portion of the end portions 179 of the data lines 171 and a portion of the drain electrodes 175, respectively. The passivation layer 180 and the gate insulating layer 140 may have a plurality of contact holes 181 exposing a portion of the end portions 129 of the gate lines 121.

A plurality of pixel electrodes 190 may be formed on the passivation layer 180, and a plurality of contact assistants 81 and 82 may be formed in the contact holes 181 and 182, respectively. The pixel electrodes 190 and the contact assistants 81 and 82 may be made of a transparent conductor, such as ITO or IZO, or a reflective conductor such as Ag or Al.

The pixel electrodes 190 may be coupled with the drain electrodes 175 through the contact holes 185, thereby allowing the pixel electrodes to receive data voltages from the drain electrodes. The pixel electrodes 190 that are supplied with data voltages generate electric fields in cooperation with a common electrode (not shown) supplied with a common voltage, which determines the orientations of liquid crystal molecules (not shown) disposed between the two electrodes or yield currents in a light emitting layer (not shown) to emit light.

Concerning an LCD, the pixel electrode 190 and a common electrode may form a capacitor called a "liquid crystal capacitor," which stores applied voltages after the TFT turns off. An additional capacitor called a "storage capacitor," which is connected in parallel to the liquid crystal capacitor, may be provided for enhancing the voltage storing capacity. The storage capacitors may be implemented by overlapping the pixel electrodes 190 with previous gate lines 121 adjacent thereto or separate signal lines.

The contact assistants 81 and 82 may have edges that are substantially aligned with edges of the contact holes 181 and 182, and they may cover and be coupled with the exposed parts of the end portions 129 and 179 through the contact holes 181 and 182, respectively. The contact assistants 81 and 82 may protect the end portions 129 and 179 and complement their adhesion with external devices.

A method for manufacturing the TFT array panel shown in FIG. 1, FIG. 2A and FIG. 2B according to an exemplary embodiment of the present invention will be described in detail with reference to FIG. 3, FIG. 4A, FIG. 4B, FIG. 5A, FIG. 5B, FIG. 6, FIG. 7A, FIG. 7B, FIG. 8A, FIG. 8B, FIG. 9, FIG. 10A, FIG. 10B, FIG. 11A and FIG. 11B, as well as FIG. 1, FIG. 2A and FIG. 2B.

Figure 3:
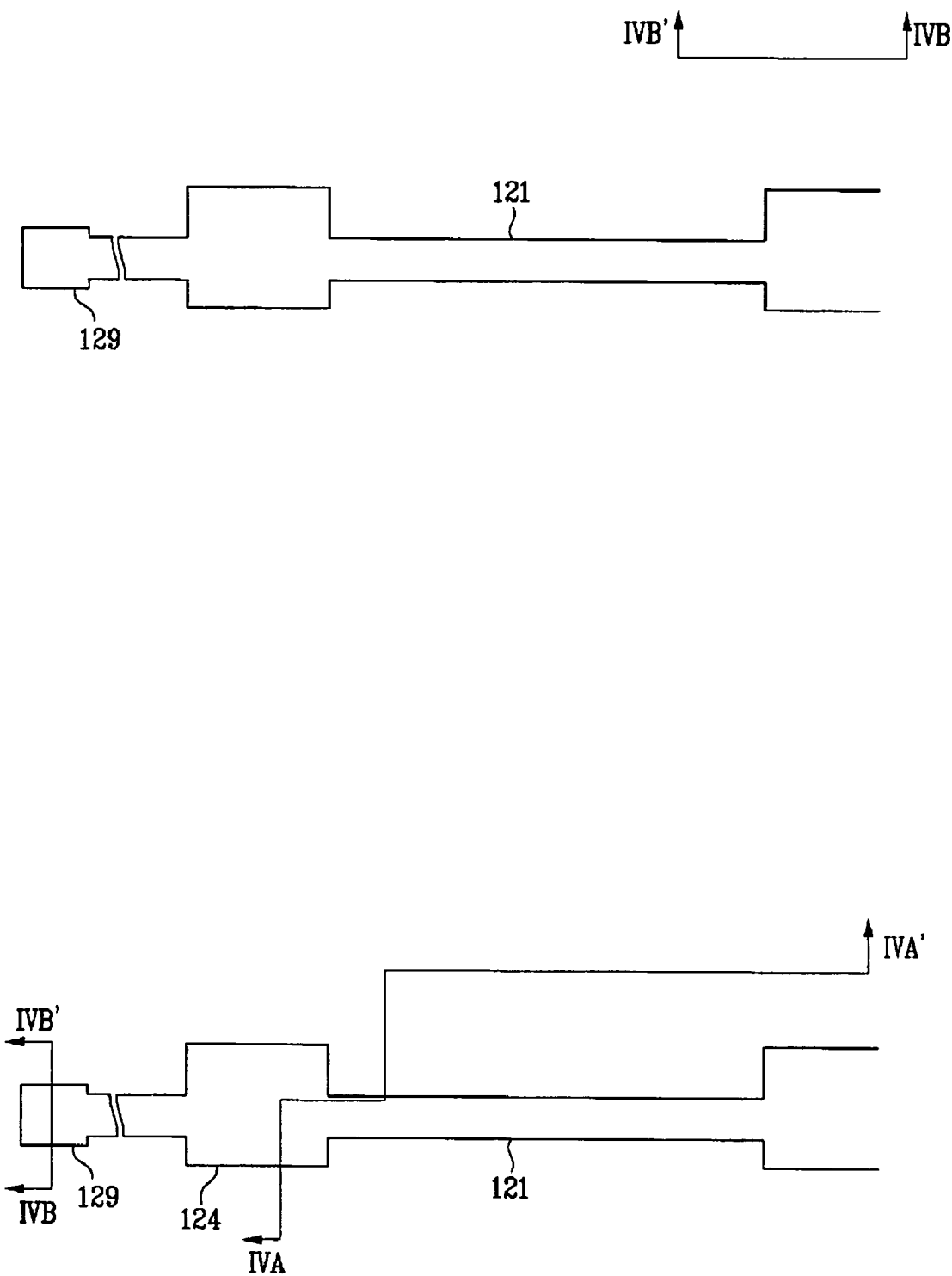
FIG. 3 is a plan view of the TFT array panel of FIG. 1, FIG. 2A and FIG. 2B showing intermediate steps of a manufacturing method thereof according to an exemplary embodiment of the present invention.
Figure 4A:
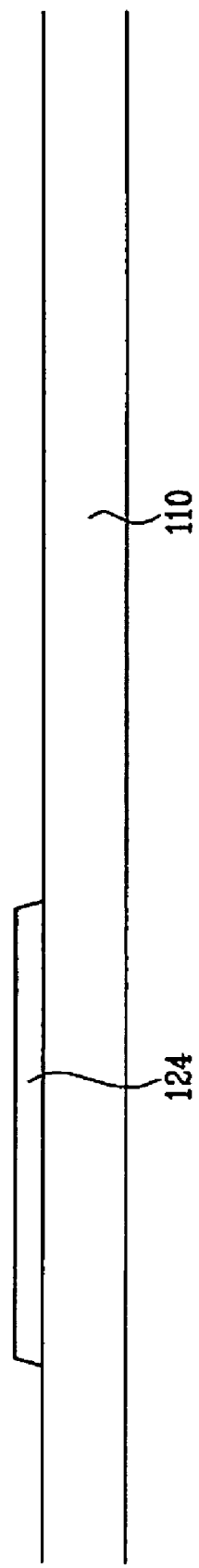
FIG. 4A and FIG. 5A are sectional views of the TFT array panel taken along line IVA–IVA' of FIG. 3.
Figure 4B:
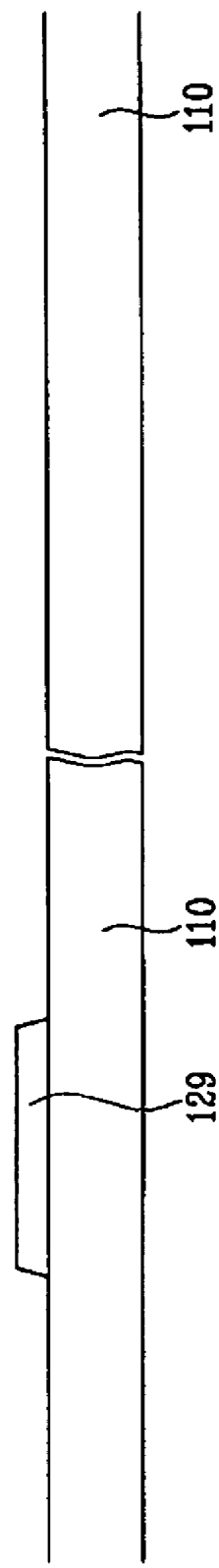
FIG. 4B and FIG. 5B are sectional views of the TFT array panel taken along lines IVB–IVB' and IVB'–IVB" of FIG. 3.
Figure 5A:
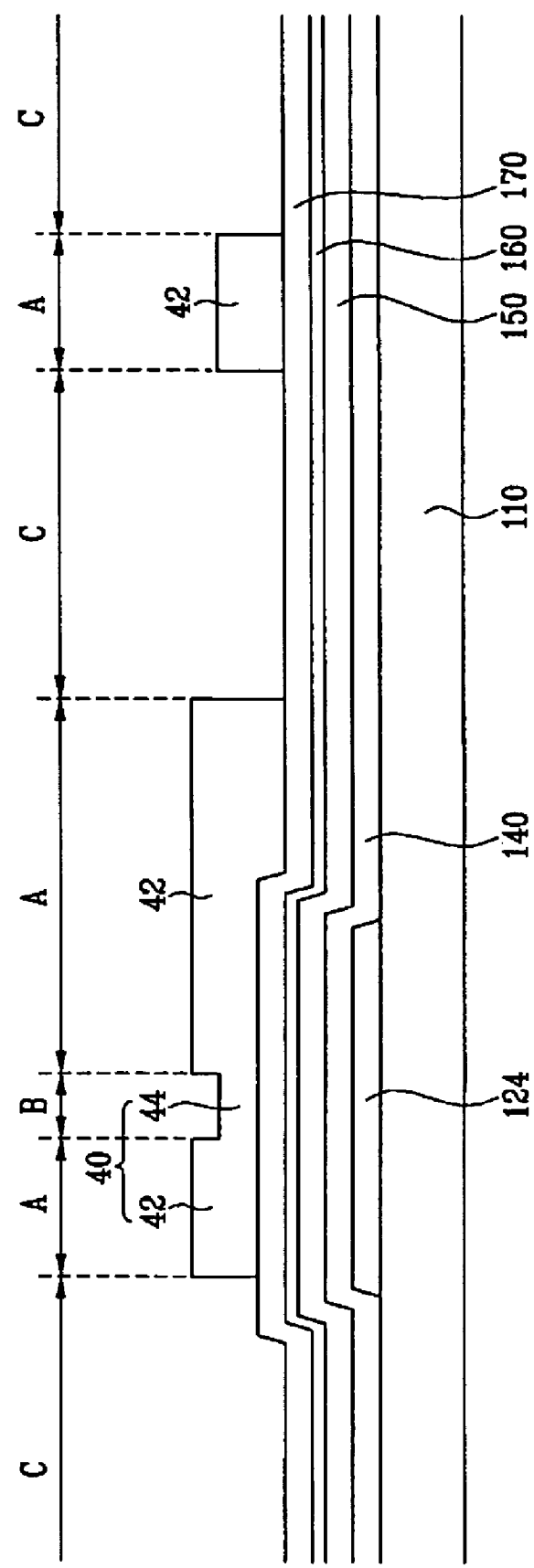
Figure 5B:
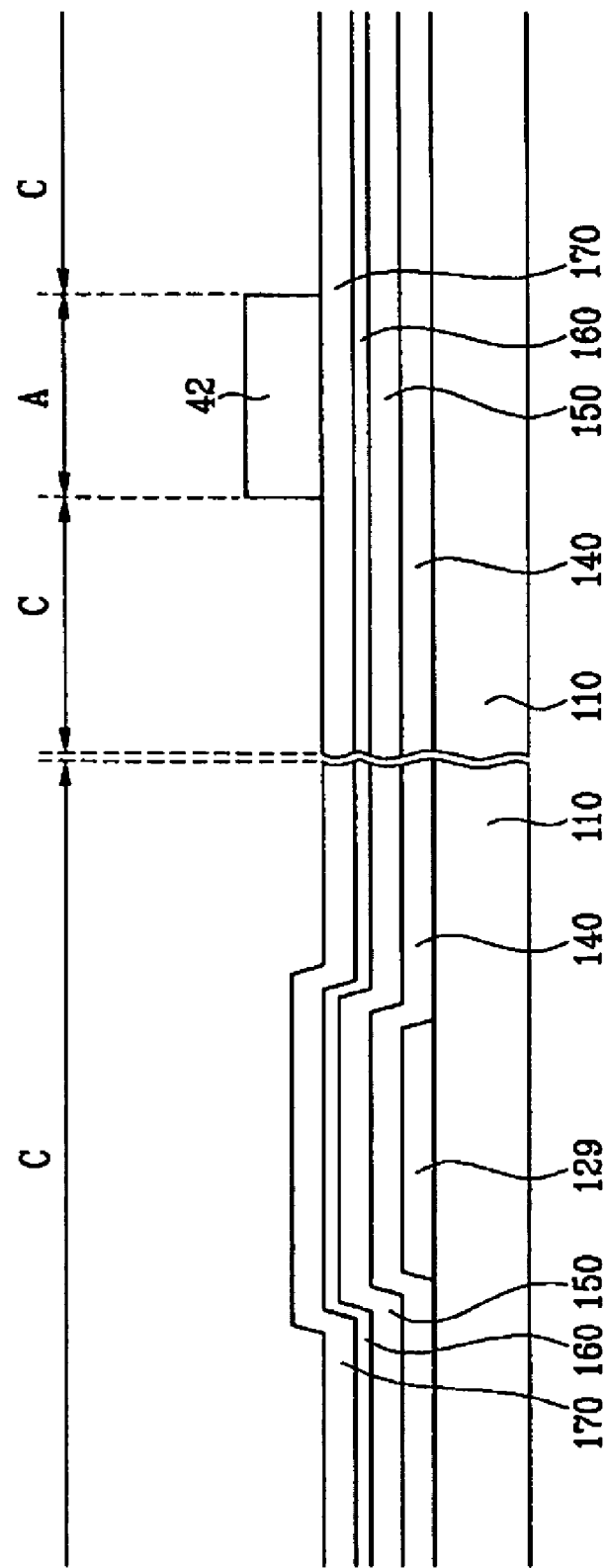
Figure 6:
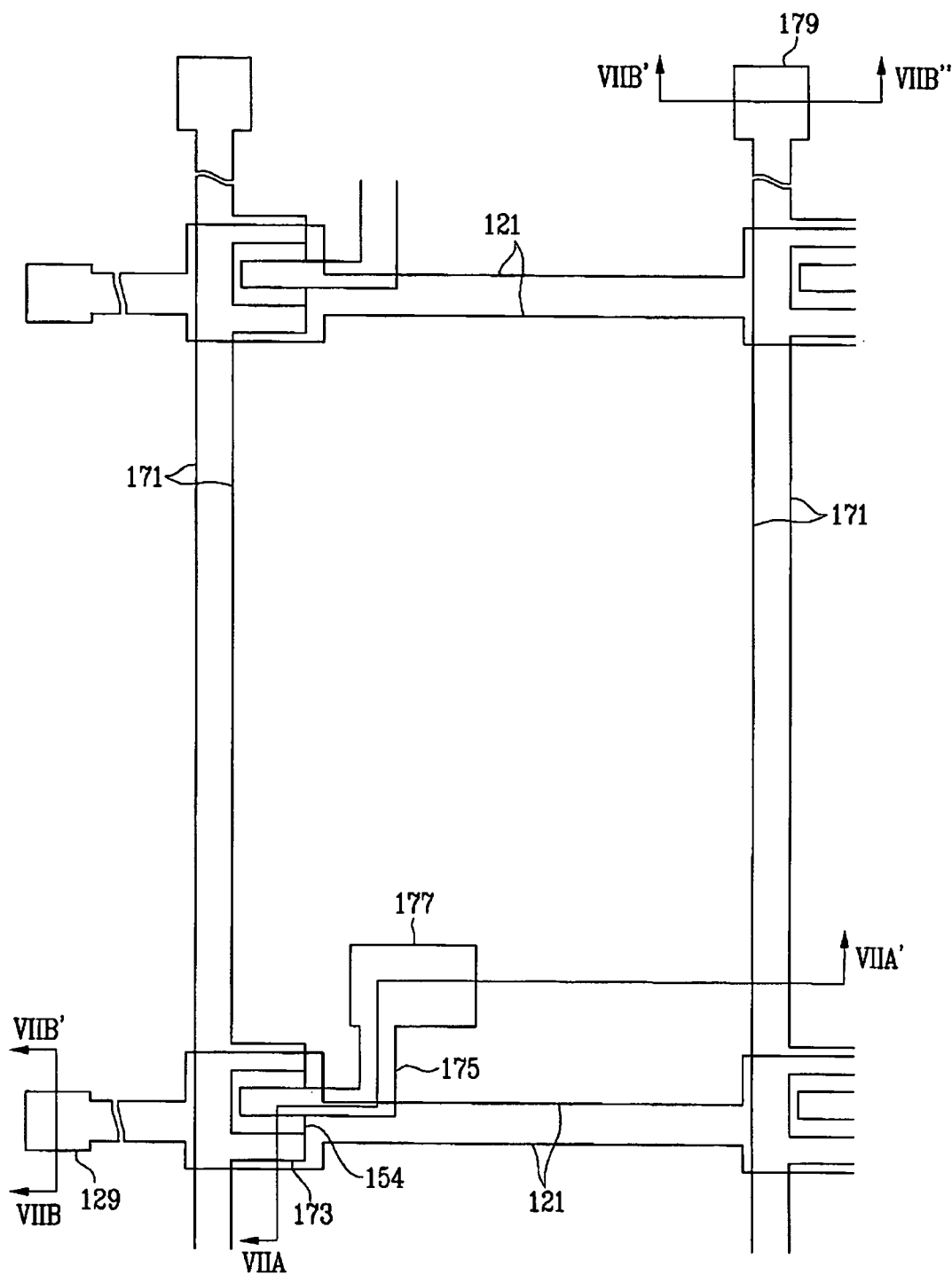
FIG. 6 is a plan view of the TFT array panel of FIG. 1, FIG. 2A and FIG. 2B showing intermediate steps of a manufacturing method thereof according to an exemplary embodiment of the present invention.
Figure 7B:
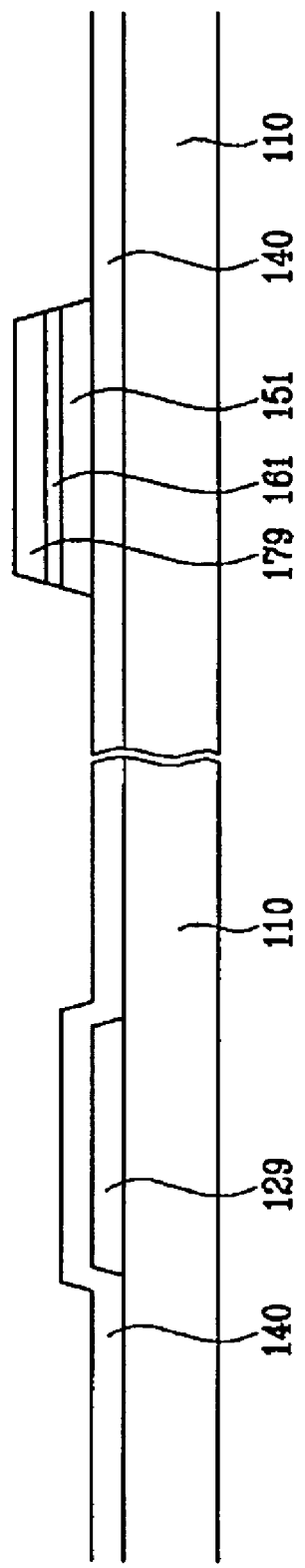
Figure 9:
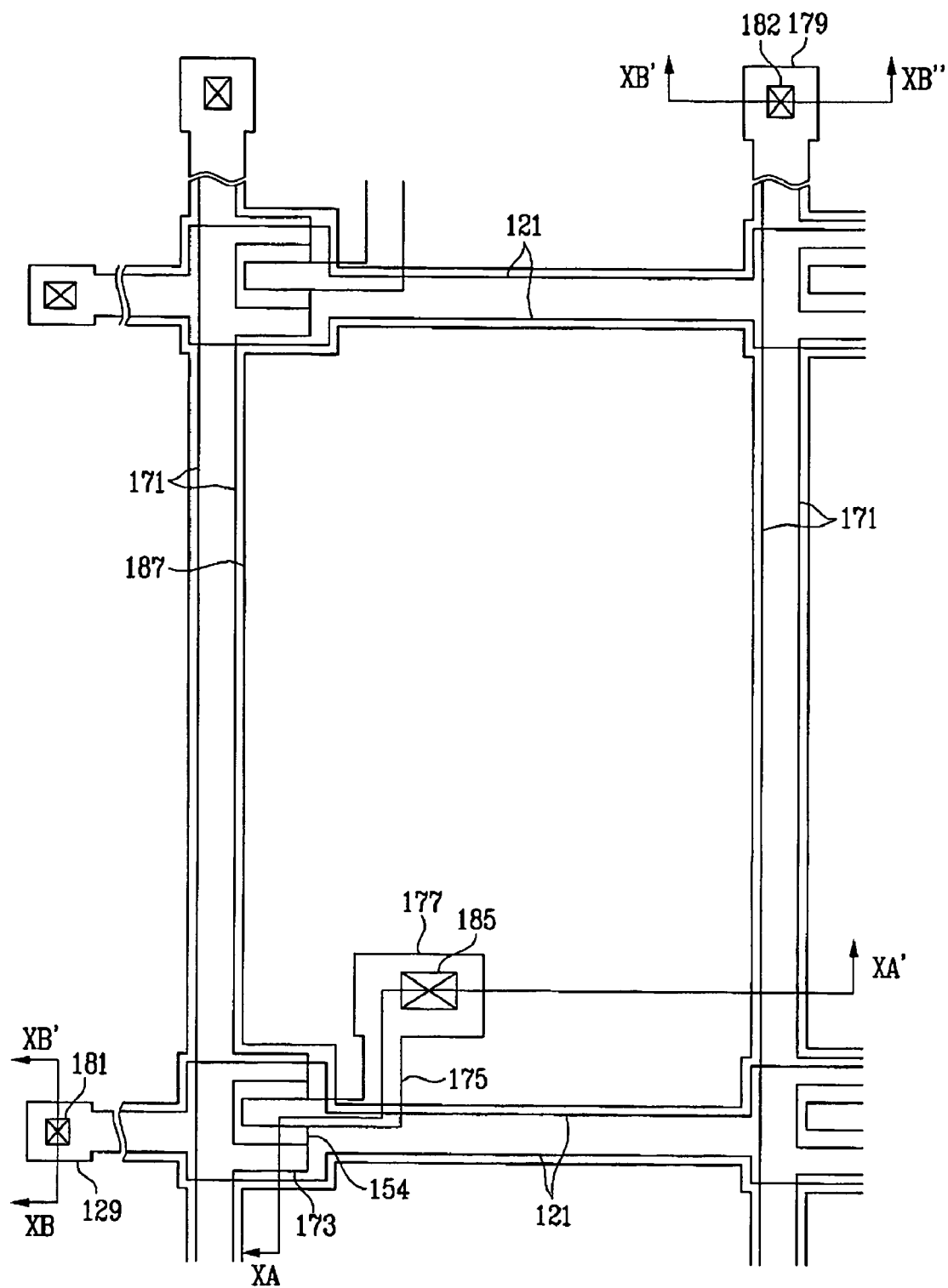
FIG. 9 is a plan view of the TFT array panel of FIG. 1, FIG. 2A and FIG. 2B showing intermediate steps of a manufacturing method thereof according to an exemplary embodiment of the present invention.
Figure 10A:
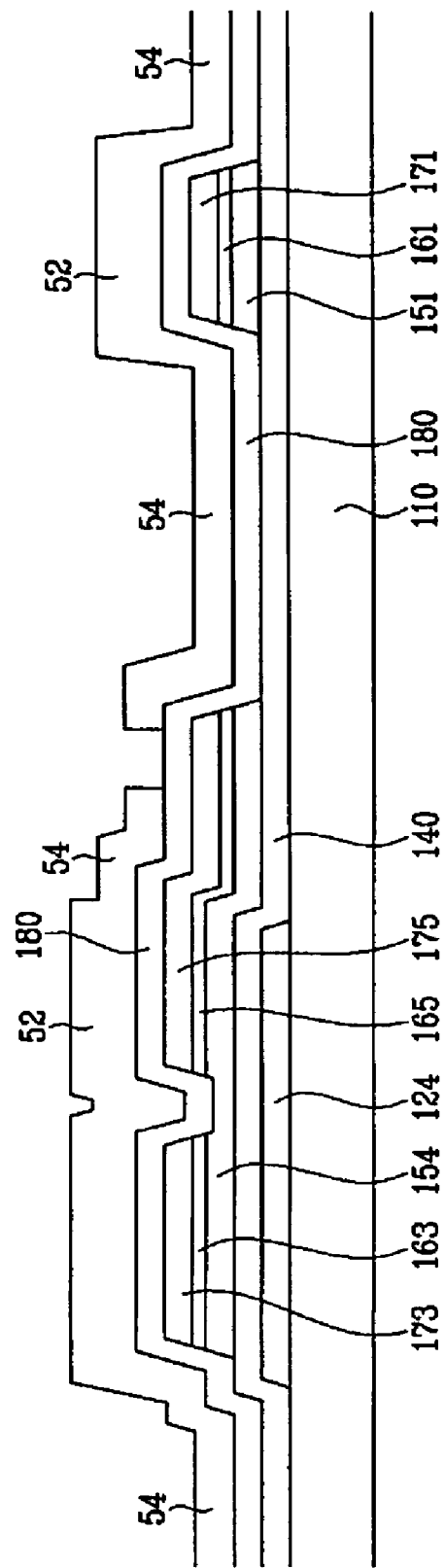
FIG. 10A, FIG. 11A and FIG. 12A are sectional views of the TFT array panel taken along line XA–XA' of FIG. 9.

FIG. 3, FIG. 6 and FIG. 9 are plan views of the TFT array panel of FIG. 1, FIG. 2A and FIG. 2B showing intermediate steps of a manufacturing method thereof according to an exemplary embodiment of the present invention. FIG. 4A and FIG. 5A are sectional views of the TFT array panel taken along line IVA–IVA' of FIG. 3, and FIG. 4B and FIG. 5B are sectional views taken along lines IVB–IVB' and IVB'–IVB" of FIG. 3. FIG. 7A and FIG. 8A are sectional views of the TFT array panel taken along line VIIA–VIIA' of FIG. 6, and FIG. 7B and FIG. 8B are sectional views taken along lines VIIB–VIIB' and VIIB'–VIIB" of FIG. 6. FIG. 10A, FIG. 11A and FIG. 12A are sectional views of the TFT array panel taken along line XA–XA' of FIG. 9, and FIG. 10B, FIG. 11B and FIG. 12B are sectional views taken along lines XB–XB' and XB'–XB" of FIG. 9.

Referring to FIG. 3, FIG. 4A and FIG. 4B, a conductive layer, which may be made of metal, may be deposited on an insulating substrate 110 that may be made of transparent glass by sputtering, etc. The conductive layer may be about 1,500–5,000 Å thick. The conductive layer is then subjected to lithography and etching to form a plurality of gate lines 121 having gate electrodes 124 and end portions 129.

Referring to FIG. 5A and FIG. 5B, a gate insulating layer 140, an intrinsic a-Si layer 150, and an extrinsic a-Si layer 160 may be sequentially deposited by CVD or other like methods. The gate insulating layer 140 may be made of silicon nitride, and it may be about 2,000–5,000 Å thick. The the gate insulating layer 140 may be deposited at deposition temperature of about 250–450° C.

A conductive layer 170, which may be made of metal, may then be deposited by sputtering, etc., and about a 1–2 micron thick photoresist film 40 may be coated on the conductive layer 170.

The photoresist film 40 is exposed to light through a photo mask (not shown) and developed such that it has different thicknesses depending upon its position. FIG. 5A and FIG. 5B show the developed photoresist film 40 with a plurality of first, second and third portions in order of decreasing thickness. The first portions, which are located on wire areas A, and the second portions, which are located on channel areas B, are indicated by reference numerals 42 and 44, respectively. A reference numeral is not assigned to the third portions, which are located on the remaining areas C, since they have substantially zero thickness to expose corresponding portions of the conductive layer 170. The thickness ratio of the second portions 44 to the first Is portions 42 may be adjusted depending upon the process conditions in the subsequent process steps. The second portions 44 may be half as thick, or less, as the first portions 42. More specifically, the second portions 44 may be about 4,000 Å thick or less.

The photoresist's position-dependent thickness may be obtained by several techniques. For example, the exposure mask may have translucent, light transmitting, and light blocking opaque areas. The translucent areas may have a slit pattern, a lattice pattern, or a thin film(s) with intermediate transmittance or intermediate thickness. When using a slit pattern, the width of the slits or the distance between the slits may be less than the resolution of a light exposer used for the photolithography. Alternatively, a reflowable photoresist may be used. In detail, after forming a photoresist pattern made of a reflowable material using a normal exposure mask having transparent and opaque areas, it is subject to a reflow process to flow onto areas without the photoresist, thereby forming thin portions.

The different thicknesses of the photoresist 42 and 44 enable selective etching of the underlying layers when using suitable process conditions. Therefore, a plurality of data lines 171, including source electrodes 173 and end portions 179, a plurality of drain electrodes 175 and wide end portions 177, a plurality of ohmic contact stripes 161, including projections 163, a plurality of ohmic contact islands 165, and a plurality of semiconductor stripes 151, including projections 154, may be obtained as shown in FIG. 6, FIG. 7A and FIG. 7B by a series of etching steps.

For descriptive purposes, portions of the conductive layer 170, the extrinsic a-Si layer 160, and the intrinsic a-Si layer 150 are referred to as first portions on the wire areas A, second portions on the channel areas B, and third portions on the remaining areas C.

An exemplary sequence of forming such a structure is as follows:

(1) Removal of third portions of the conductive layer 170, the extrinsic a-Si layer 160 and the intrinsic a-Si layer 150;
(2) Removal of the second portions 44 of the photoresist;
(3) Removal of the second portions of the conductive layer 170 and the extrinsic a-Si layer 160; and
(4) Removal of the first portions 42 of the photoresist.

Another exemplary sequence is as follows:

(1) Removal of the third portions of the conductive layer 170;
(2) Removal of the second portions 44 of the photoresist;
(3) Removal of the third portions of the extrinsic a-Si layer 160 and the intrinsic a-Si layer 150;
(4) Removal of the second portions of the conductive layer 170;
(5) Removal of the first portions 42 of the photoresist; and
(6) Removal of the second portions of the extrinsic a-Si layer 160.

The second portions 44 of the photoresist may be removed either simultaneously with or independently from the third portions of the extrinsic a-Si layer 160 and of the intrinsic a-Si layer 150. Similarly, the first portions 42 of the photoresist may be removed either simultaneously with or independently from the second portions of the extrinsic a-Si layer 160. For example, a gas mixture of SF6 and HCl or SF6 and O2 may etch the photoresist and the a-Si layers 150 and 160 with a substantially equal etch ratio.

Photoresist residue on the surface of the conductive layer 170 may be removed by ashing, etc. Referring to FIG. 8A and FIG. 8B, a passivation layer 180 may be deposited on the substrate and coated with a positive photoresist film 50. A photo mask 60 may then be aligned is with the substrate 110.

The photo mask 60 includes a transparent substrate 61 and an opaque light blocking film 62, and the mask is divided into light transmitting areas TA1, light blocking areas BA1, and translucent areas SA1. The light blocking film 62 is disposed on the light blocking areas BA1 and the translucent areas SA1, but not on the light transmitting areas TA1. In the light blocking areas BA1, the light blocking film 62 is wider than a predetermined value, and in the translucent areas SA1, it has a plurality of areas for forming slits. The translucent areas SA1 may face areas enclosed by the gate lines 121 and the data lines 171, the light transmitting areas TA1 may face the end portions 129 of the gate lines 121, the end portions 179 of the data lines 171, and portions of the drain electrodes 175, and the light blocking areas BA1 may face the remaining portions.

The photoresist 50 is exposed to light through the photo mask 60 and developed, thereby removing portions of the photoresist 50 receiving a predetermined amount of light. Referring to FIG. 8A and FIG. 8B, portions of the photoresist 50 facing the light transmitting areas TA1 are removed, portions of the photoresist 50 facing the translucent areas SA1 become thinner, and portions of the photoresist 50 facing the light blocking areas BA1 remain. In the figures, the hatched portions indicate the portions of the photoresist 50 that are removed by development.

Referring to FIG. 9, FIG. 10A, FIG. 10B, FIG. 11A and FIG. 11B, the passivation layer 180 is etched, using the remaining portions 52 and 54 of the photoresist 50 as an etch mask, to form a plurality of contact holes 182 and 185 exposing the end portions 179 of the data lines 171 and portions of the drain electrodes 175, respectively. The passivation layer 180 and the gate insulating layer 140 are etched to form a plurality of contact holes 181 exposing the end portions 129 of the gate lines 121. The contact holes 181, 182 and 185 may be simultaneously formed by appropriately setting etch conditions. For example, an etch condition may be set where insulators such as the passivation layer 180 and the gate insulating layer 140 are etched without etching metals. Etching for an appropriate amount of time and etching selectivity under such conditions will remove portions of the passivation layer on the data pads and portions of the passivation layer and gate insulating layer on the gate pad.

Figure 11A:
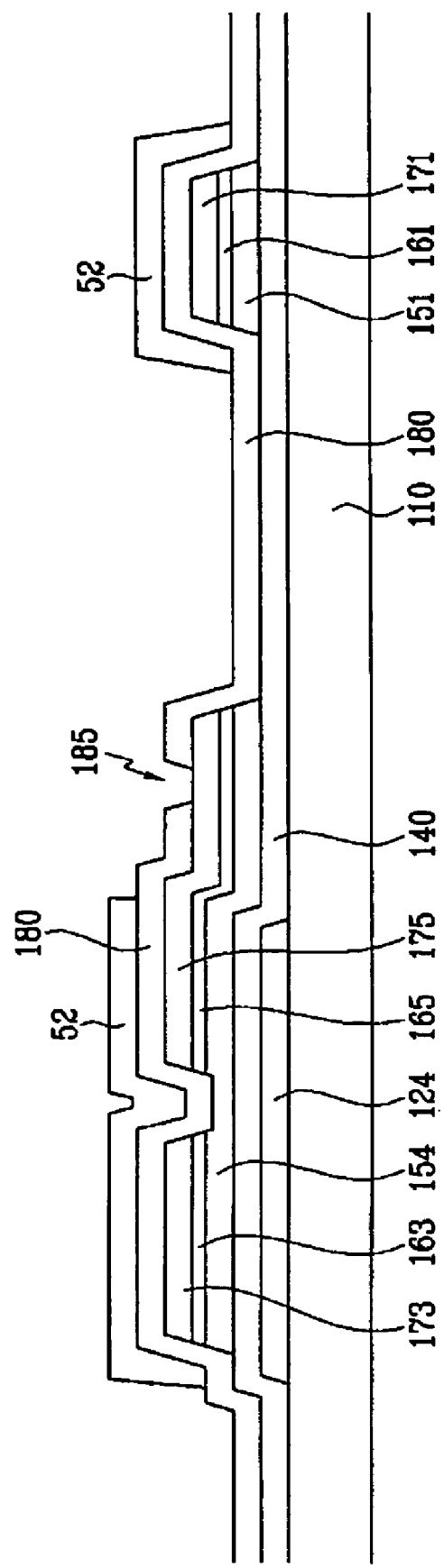
Figure 11B:
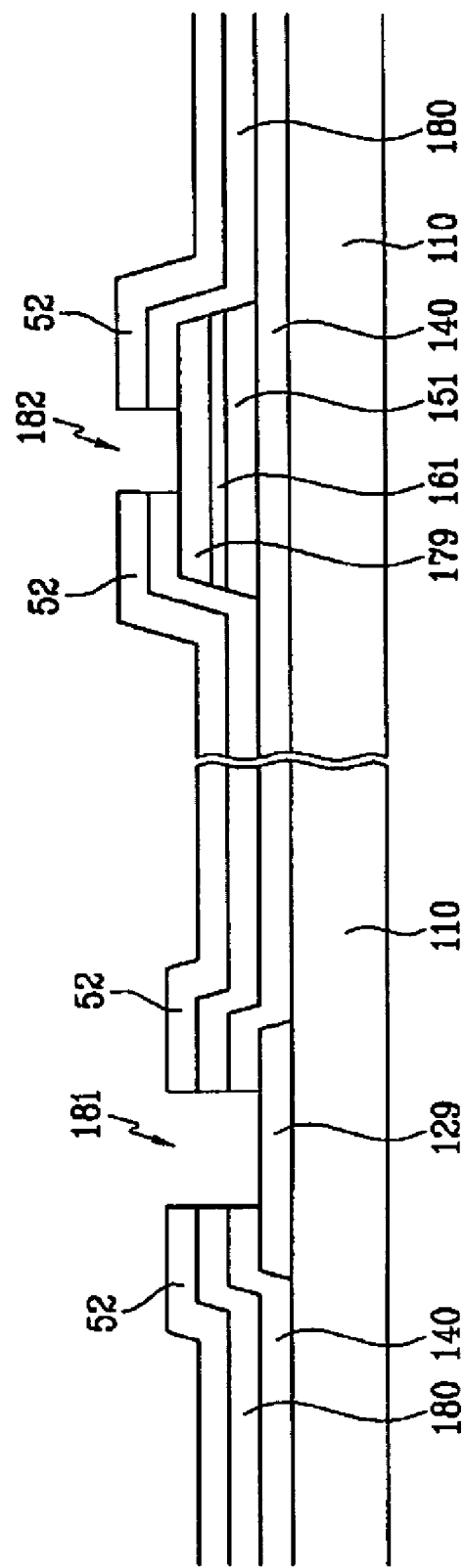
Figure 12A:
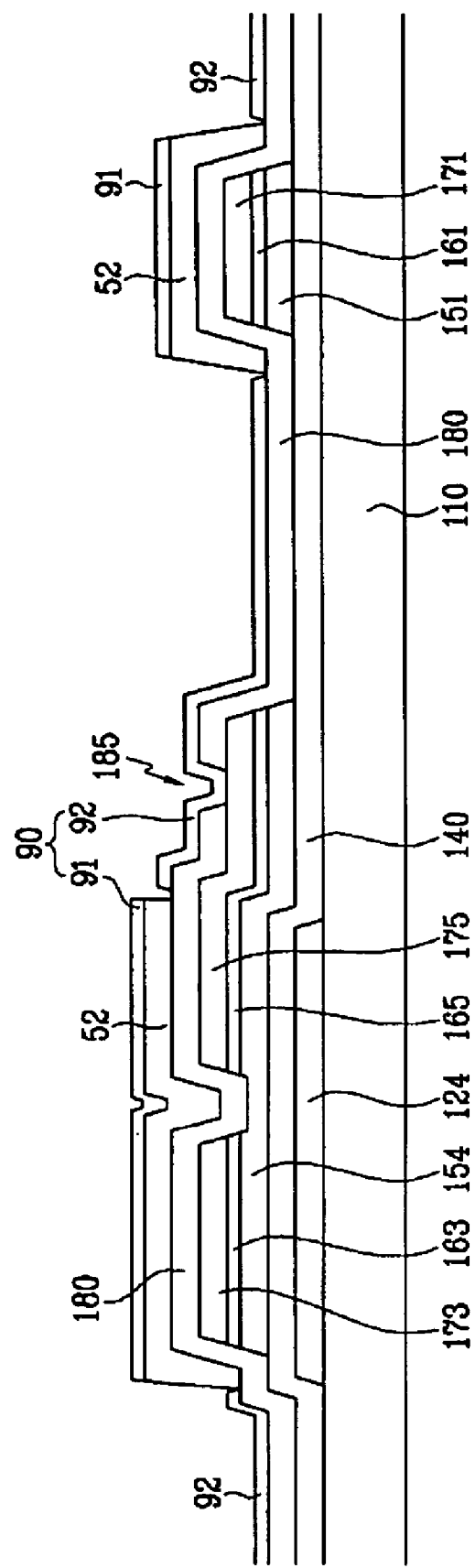

Referring to FIG. 11A and FIG. 11B, the thin portions 54 of the photoresist 50 may be removed by ashing, etc., and the thickness of the thick portions 52 is decreased.

Figure 12B:
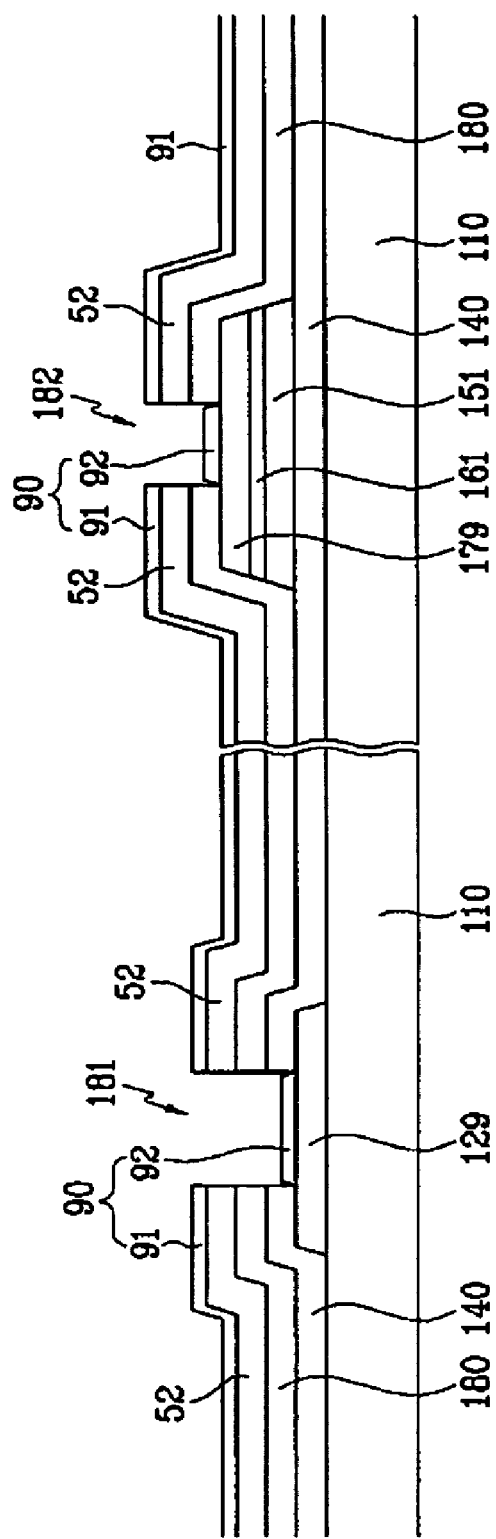

Referring to FIG. 12A and FIG. 12B, a conductive film 90, which may be made of IZO, ITO, amorphous ITO, or other like materials, may be deposited by sputtering, etc.

The conductive film 90 includes first portions 91, which are disposed on the photoresist 52, and remaining second portions 92. The conductive film's first and second portions 91 and 92 are separated from each other by the thickness of the photoresist 52, which has its lateral sides at least partly exposed.

The substrate 110 may then be dipped into a developer such that the developer infiltrates into the photoresist 52 through its exposed lateral sides, thereby removing the photoresist 52. The first portions 91 of the conductive film 90 are simultaneously removed with the photoresist 52, which is referred to as "lift-off." Consequently, the conductive film's second portions 92 remain to form a plurality of pixel electrodes 190 and a plurality of contact assistants 81 and 82, as shown in FIG. 1, FIG. 2A and FIG. 2B.

The manufacturing method of the TFT array panel according to an exemplary embodiment of the present invention is simplified because it simultaneously forms the data lines 171, the drain electrodes 175, the semiconductors 151, and the ohmic contacts 161 and 165 using is a lithography step, and it omits a lithography step for forming the pixel electrodes 190 and the contact assistants 81 and 82.

Figure 10B:
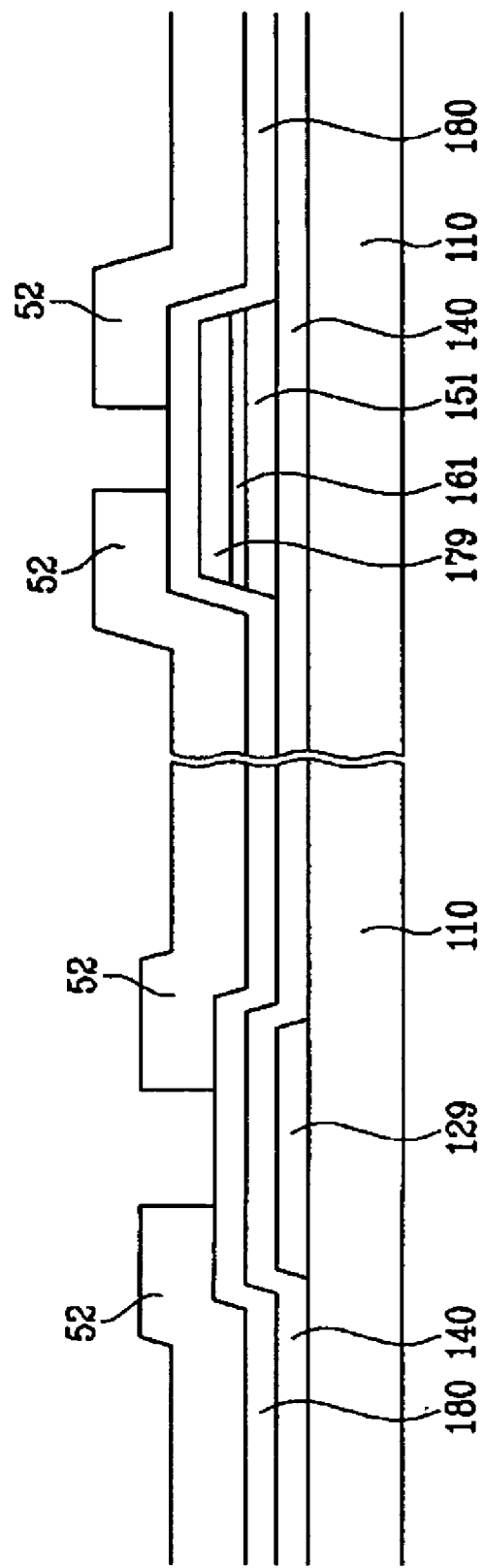
FIG. 10B, FIG. 11B and FIG. 12B are sectional views of the TFT array panel taken along lines XB–XB' and XB'–XB" of FIG. 9.

Although the passivation layer 180 and the gate insulating layer 140, disposed on the end portions 129 of the gate lines 121, and the passivation layer 180, disposed on the end portions 179 of the data lines 171, are simultaneously etched as shown in FIG. 10B and FIG. 11B, the present invention is not limited to this.

For example, the translucent areas SA1 of the mask 60 may include the areas facing the contact holes 182 in addition to the areas facing the pixel electrodes 190. Thus, the portions of photoresist 50 disposed on the contact holes 182 are not completely removed after developing the photoresist. Accordingly, thin portions of the photoresist 50 may exist on the contact holes 182 as well as on the pixel electrodes 190, while no photoresist remains on the contact holes 181 and 185. Thereafter, the passivation layer 180 may be etched using the photoresist 52 and 54 as an etch mask to form the contact holes 185 exposing the drain electrodes 175 and to expose portions of the gate insulating layer 140 on the contact holes 181. After removing the photoresist's second portions 54, the exposed portions of the gate insulating layer 140 and the passivation layer 180 may be etched to form the contact holes 181, and the exposed portions of the passivation layer 180 may be etched to form the contact holes 182.

Now, a TFT array panel according to another exemplary embodiment of the present invention will be described in detail with reference to FIG. 13, FIG. 14A and FIG. 14B.

Figure 13:
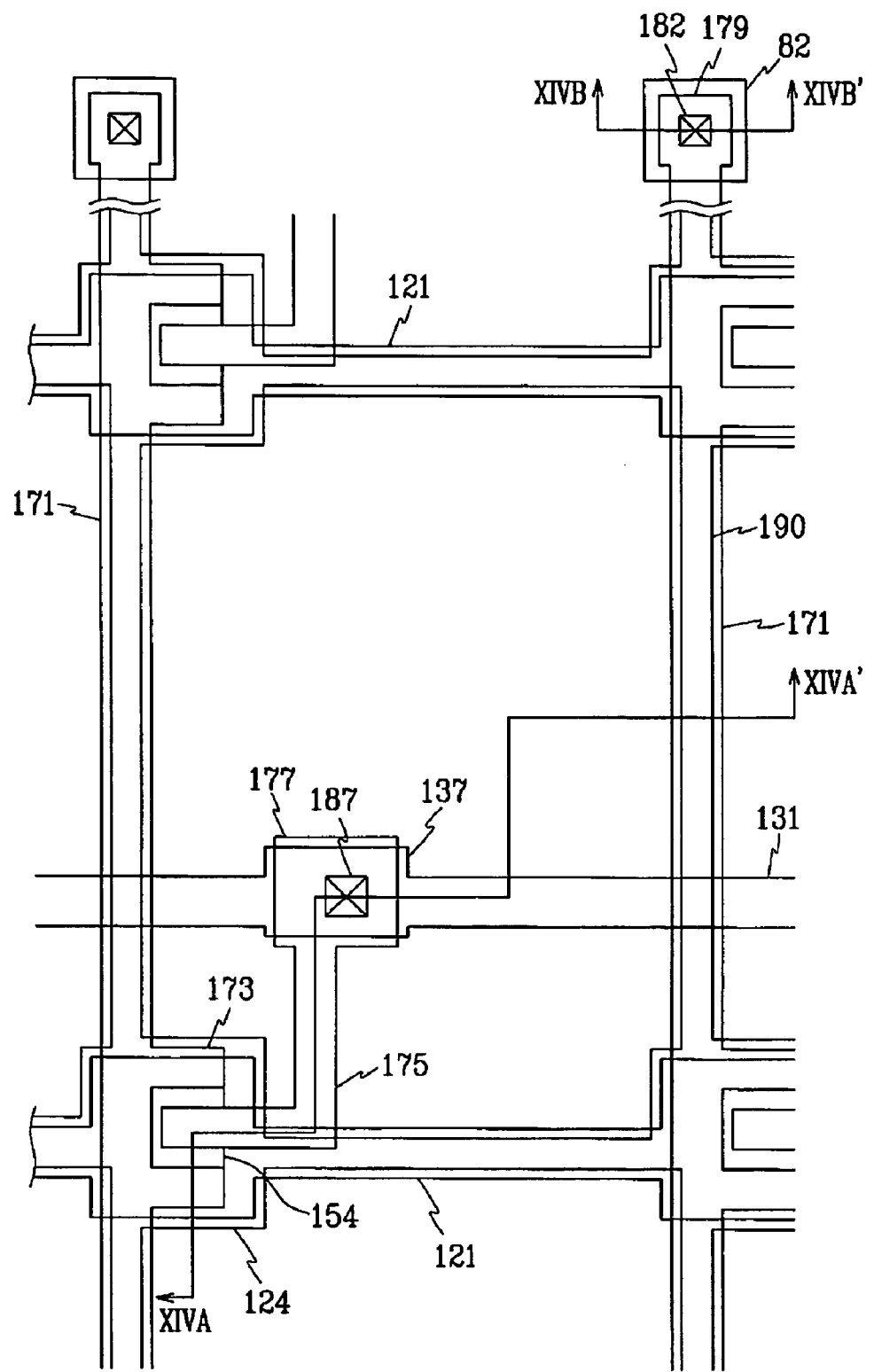
FIG. 13 is a plan view of a TFT array panel according to another exemplary embodiment of the present invention.
Figure 14A:
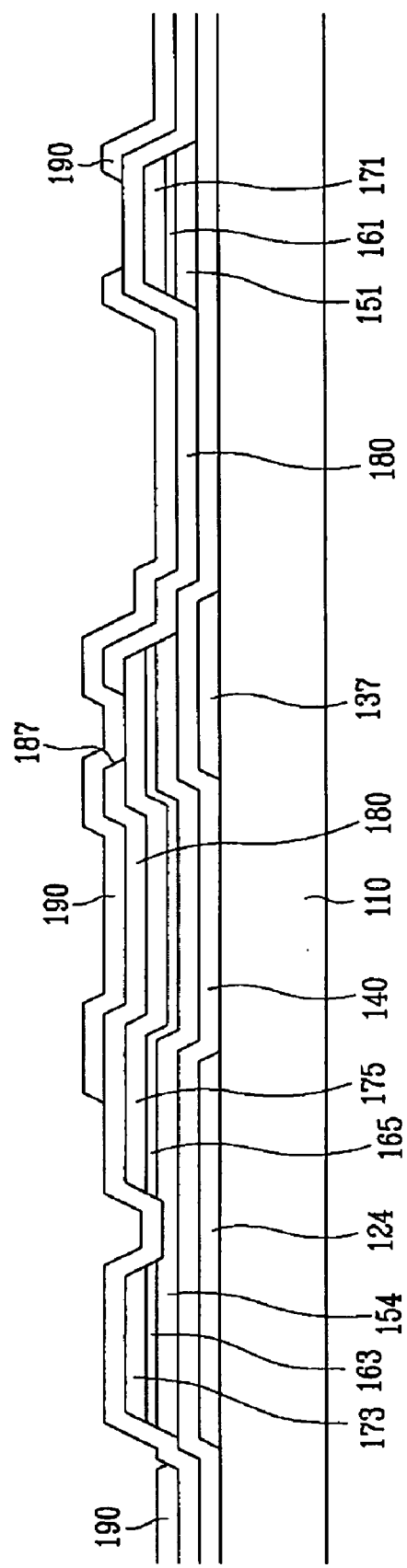
FIG. 14A is a sectional view of the TFT array panel taken along line XIVA–XIVA' of FIG. 13.
Figure 14B:
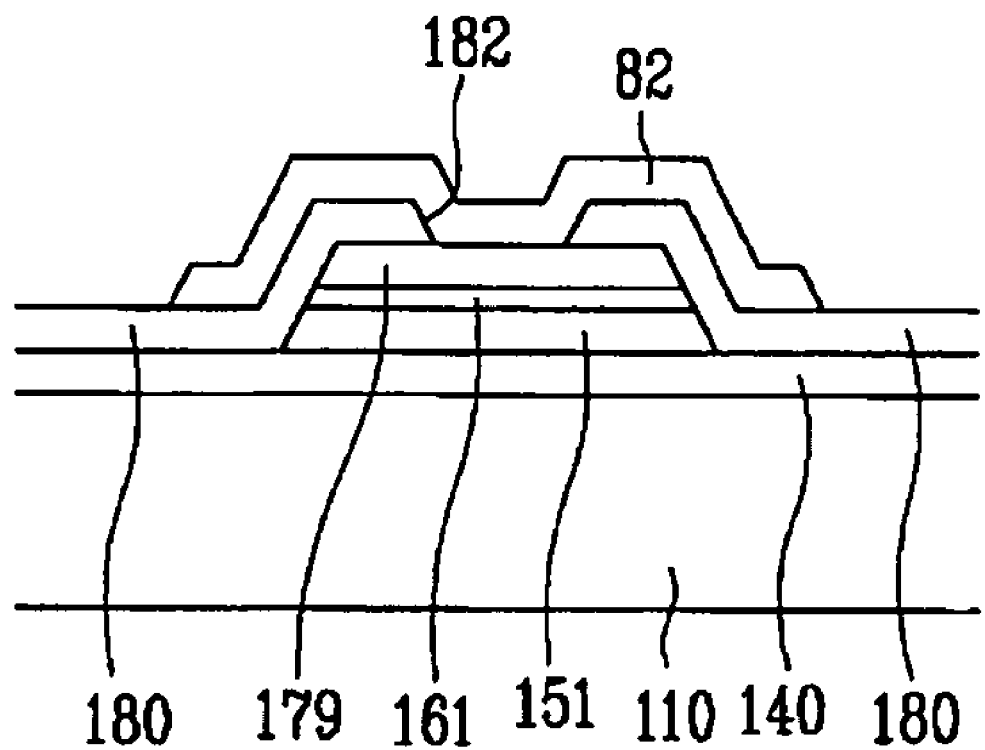
FIG. 14B is a sectional view of the TFT array panel taken along line XIVB–XIVB' of FIG. 13.

FIG. 13 is a plan view of a TFT array panel according to another exemplary embodiment of the present invention, and FIG. 14A and FIG. 14B are sectional views of the TFT array panel taken along lines XIVA–XIVA' and XIVB–XIVB' of FIG. 13, respectively.

A layered structure of the TFT array panel according to this exemplary embodiment is similar to that shown in FIG. 1, FIG. 2A and FIG. 2B.

That is, a plurality of gate lines 121, including gate electrodes 124, may be formed on a substrate 110, a gate insulating layer 140, a plurality of semiconductor stripes 151, including projections 154, a plurality of ohmic contact stripes 161, including projections 163, and a plurality of ohmic contact islands 165 may be sequentially formed thereon. A plurality of data lines 171, including source electrodes 173 and end portions 179, and a plurality of drain electrodes 175, including wide end portions 177, may be formed on the ohmic contacts 161 and 165, and a passivation layer 180 may be formed thereon. A plurality of contact holes 182 and 187 may be formed in the passivation layer 180. A plurality of pixel electrodes 190 may be formed on the passivation layer 180, and a plurality of contact assistants 82 may be formed on the contact holes 182.

Unlike the TFT array panel shown in FIG. 1, FIG. 2A and FIG. 2B, the TFT array panel according to this exemplary embodiment further includes a plurality of storage electrode lines 131 disposed on the same layer as the gate lines 121. The storage electrode lines 131 extend substantially parallel to the gate lines 121, and they are supplied with a predetermined voltage such as a common voltage, which may also be applied to a common electrode (not shown) on a common electrode panel (not shown). Each storage electrode line 131 includes a plurality of expansions 137, projecting upward and downward, that may be overlapped by the wide end portions 177 of the drain electrodes 175.

The storage electrodes 131 are overlapped by the pixel electrodes 190, and the drain electrodes 175 connected thereto, to form storage capacitors. Since the wide end portions 177 of the drain electrodes 175 overlap the expansions 137 of the storage electrode line 131, the capacitance of the storage capacitors, i.e., the storage capacitance, may be large.

The pixel electrodes 190 may also overlap the gate lines 121 and the data lines 171 to increase the aperture ratio.

The contact assistants 82 may extend from the contact holes 182 to the surface of the passivation layer 180.

Now, a method of manufacturing the TFT array panel shown in FIG. 13, FIG. 14A and FIG. 14B according to an exemplary embodiment of the present invention will be described in detail with reference to FIG. 15, FIG. 16A, FIG. 16B, FIG. 17, FIG. 18A, FIG. 18B, FIG. 19A, FIG. 19B, FIG. 20, FIG. 21A, FIG. 21B, FIG. 22A, FIG. 22B, FIG. 23A and FIG. 23B, as well as FIG. 13, FIG. 14A and FIG. 14B.

Figure 15:
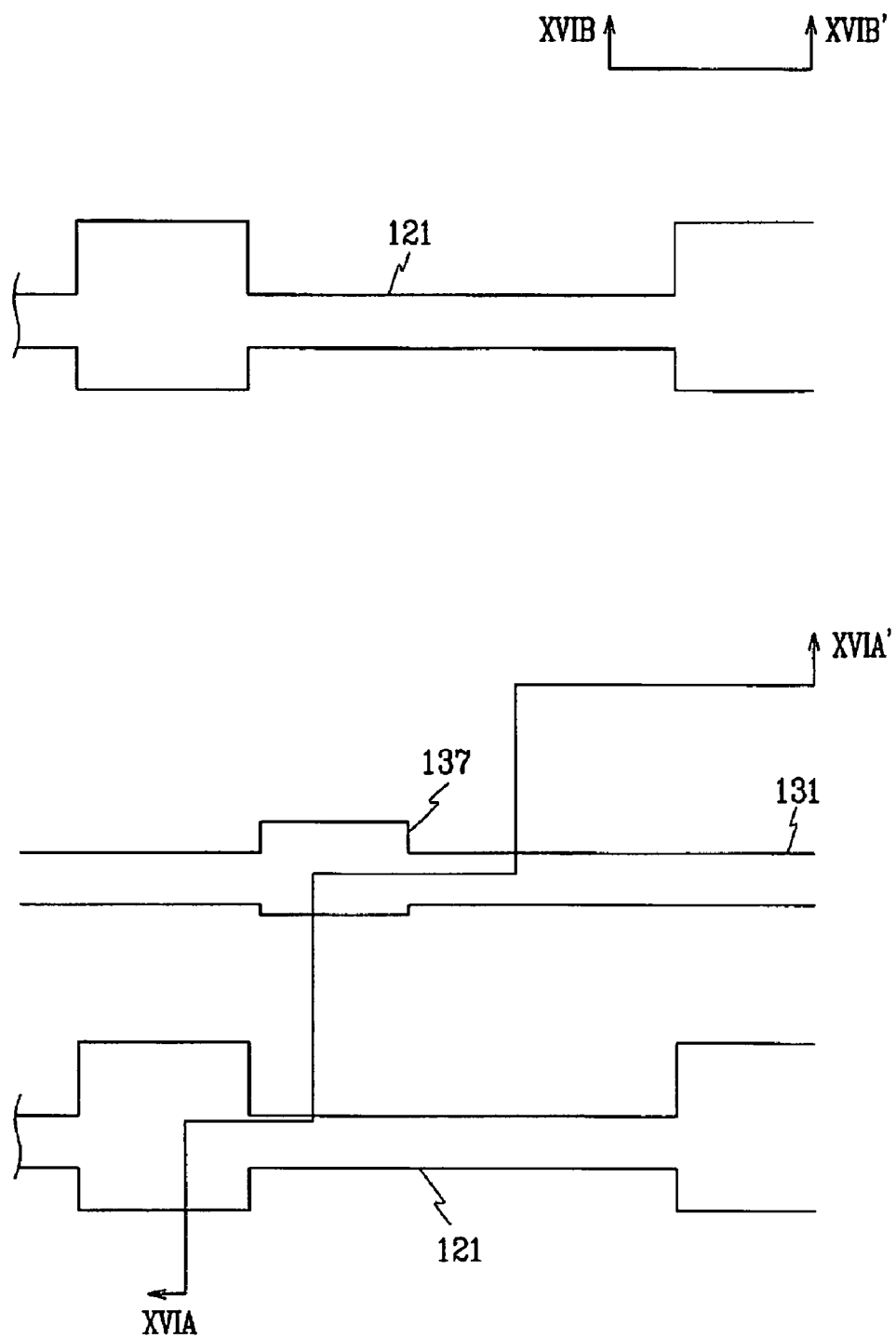
FIG. 15 is a plan view of the TFT array panel of FIG. 13, FIG. 14A and FIG. 14B showing intermediate steps of a manufacturing method thereof according to an exemplary embodiment of the present invention.
Figure 16A:
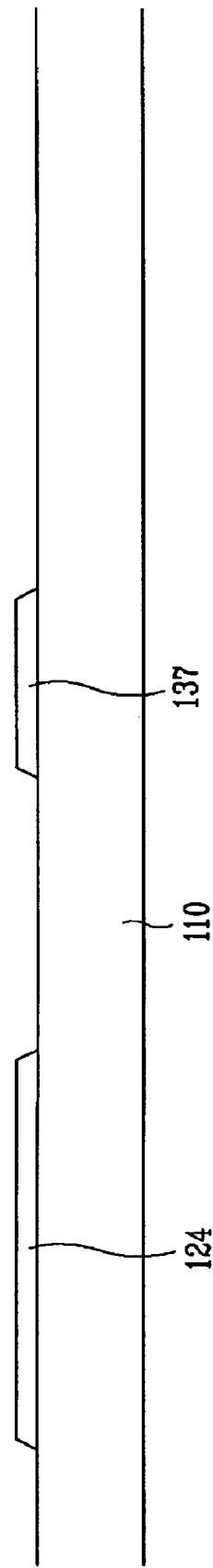
FIG. 16A is a sectional view of the TFT array panel taken along line XVIA–XVIA' of FIG. 15.
Figure 16B:
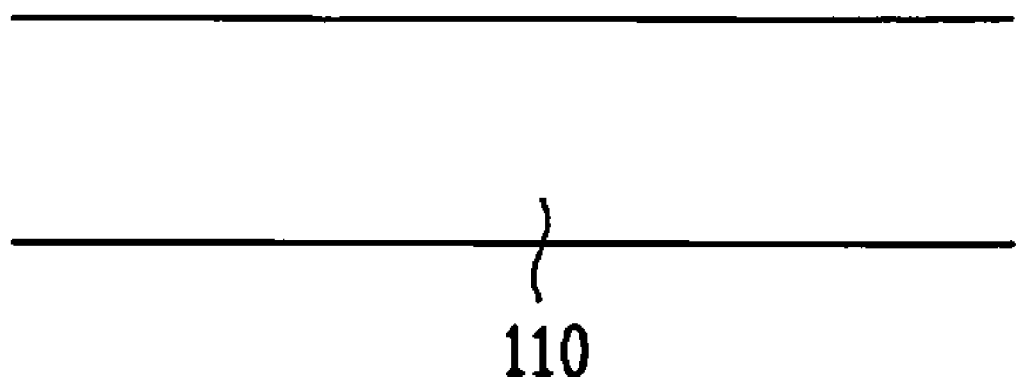
FIG. 16B is a sectional view of the TFT array panel taken along line XVIB–XVIB' of FIG. 15.
Figure 17:
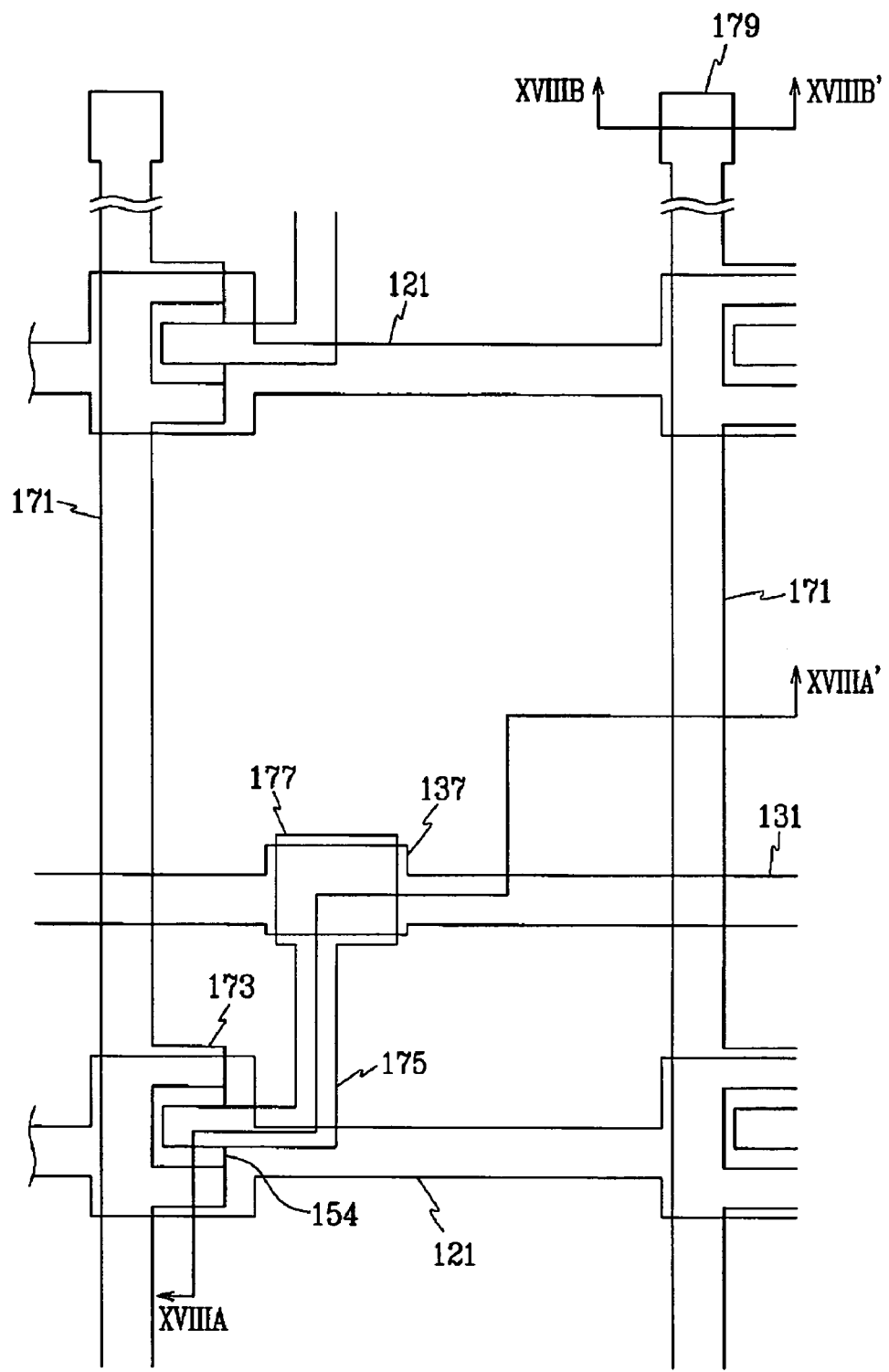
FIG. 17 is a plan view of the TFT array panel of FIG. 13, FIG. 14A and FIG. 14B showing intermediate steps of a manufacturing method thereof according to an exemplary embodiment of the present invention.
Figure 18A:
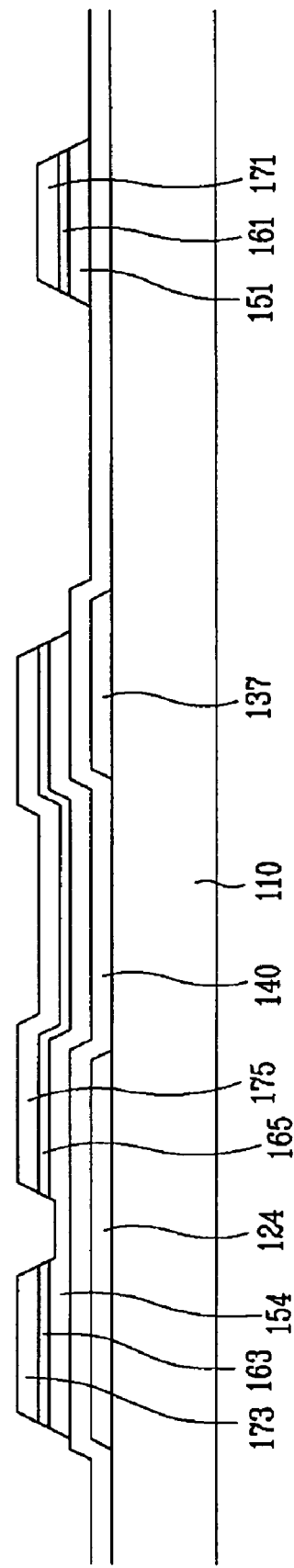
FIG. 18A and FIG. 19A are sectional views of the TFT array panel taken along line XVIIIA–XVIIIA' of FIG. 17.
Figure 18B:
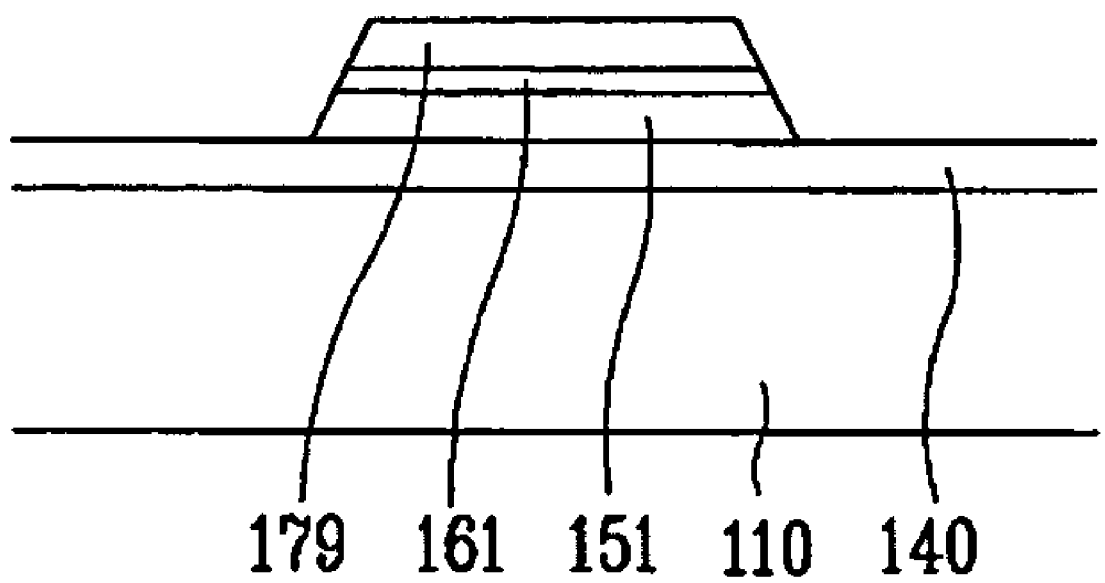
Figure 19A:
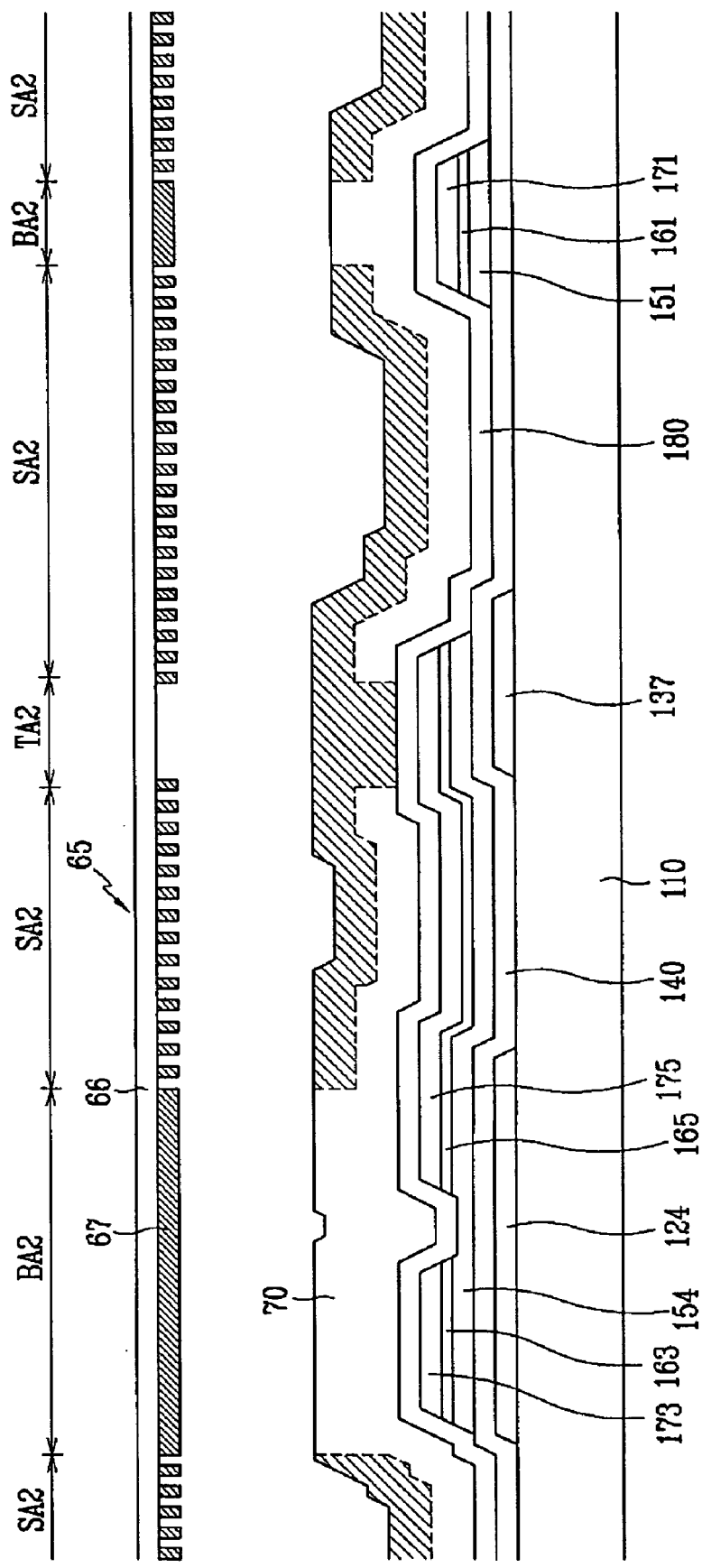
Figure 20:
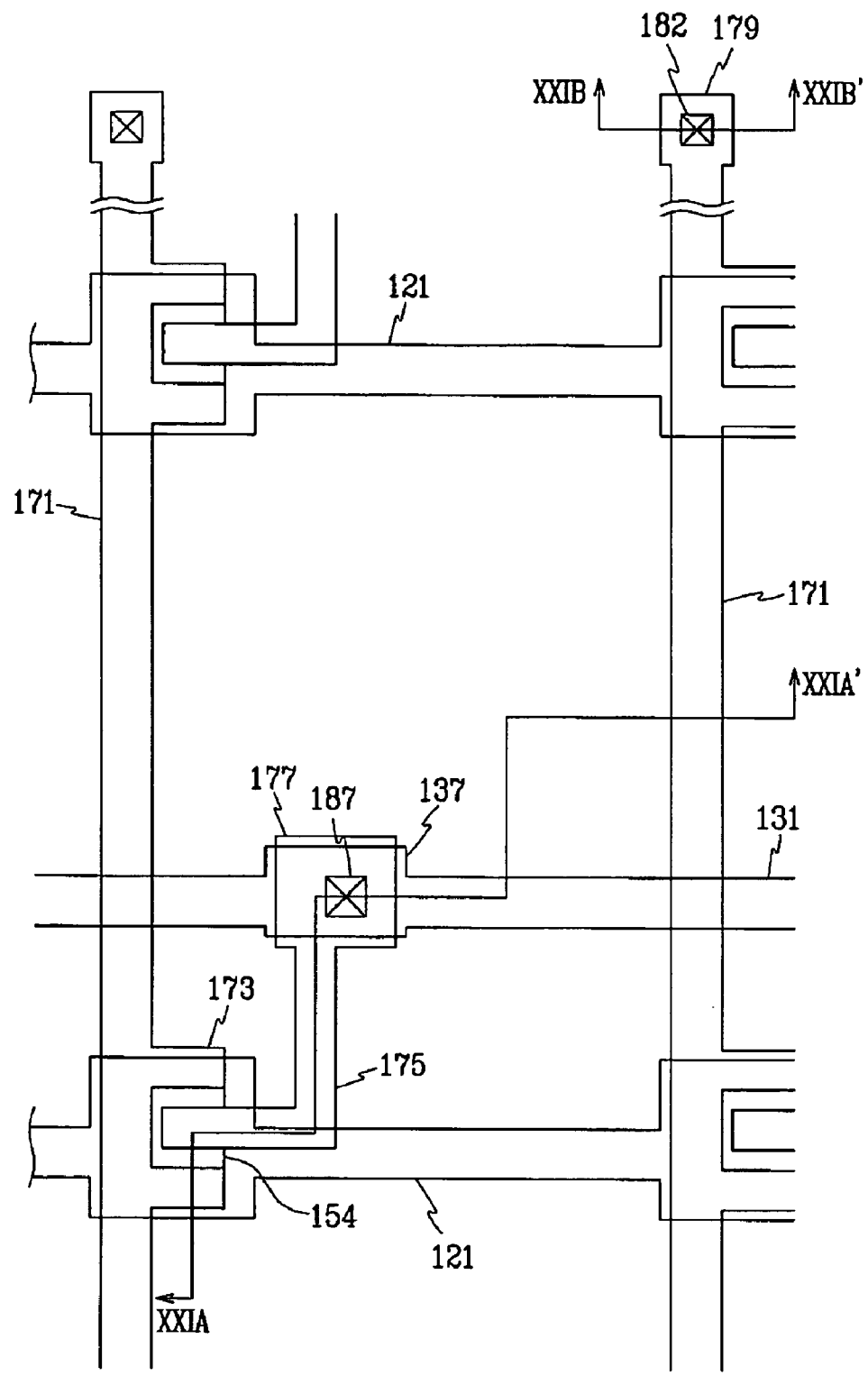
FIG. 20 is a plan view of the TFT array panel of FIG. 13, FIG. 14A and FIG. 14B showing intermediate steps of a manufacturing method thereof according to an exemplary embodiment of the present invention.
Figure 21A:
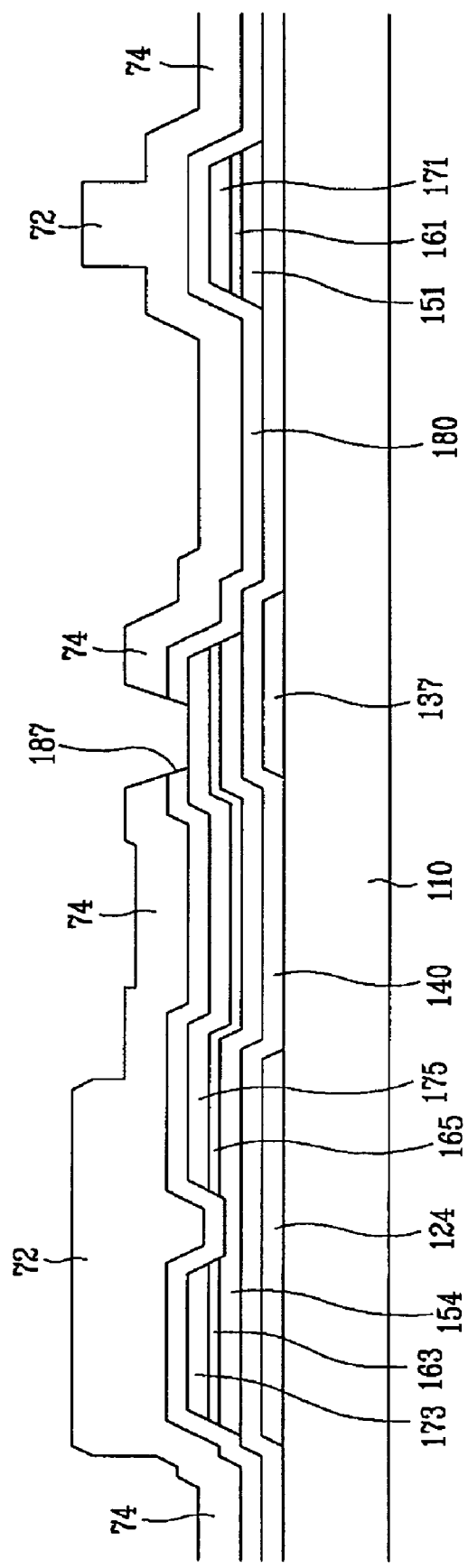
FIG. 21A, FIG. 22A, and FIG. 23A are sectional views of the TFT array panel taken along line XXIA–XXIA' of FIG. 20.

FIG. 15, FIG. 17 and FIG. 20 are plan views of the TFT array panel of FIG. 13, FIG. 14A and FIG. 14B showing intermediate steps of a manufacturing method thereof according to an exemplary embodiment of the present invention. FIG. 16A and FIG. 16B are sectional views of the TFT array panel taken along line XVIA–XVIA' and line XVIB–XVIB' of FIG. 15, respectively. FIG. 18A and FIG. 19A are sectional views of the TFT array panel taken along line XVIIIA–XVIIIA' of FIG. 17, and FIG. 18B and FIG. 19B are sectional views taken along line XVIIIB–XVIIIB' of FIG. 17. FIG. 21A, FIG. 22A and FIG. 23A are sectional views of the TFT array panel taken along line XXIA–XXIA' of FIG. 20, and FIG. 21B, FIG. 22B and FIG. 23B are sectional views taken along line XXIB–XXIB' of FIG. 20.

Referring to FIG. 15, FIG. 16A and FIG. 16B, a plurality of gate lines 121, including gate electrodes 124 and end portions 129 (as shown in FIG. 1), and a plurality of storage electrode lines 131, including expansions 137, may be formed on an insulating substrate 110, which may be made of transparent glass.

Referring to FIG. 17, FIG. 18A and FIG. 18B, a plurality of semiconductor stripes 151, including projections 154, a plurality of ohmic contact stripes 161, including projections 163, a plurality of ohmic contact islands 165, a plurality of data lines 171, including source electrodes 173 and end portions 179, and a plurality of drain electrodes 175, including wide end portions 177, may be formed as described with reference to FIG. 5A, FIG. 5B, FIG. 6, FIG. 7A and FIG. 7B.

Referring to FIG. 19A and FIG. 19B, a passivation layer 180 may be deposited and coated with a positive photoresist film 70. Thereafter, a photo mask 65 may be aligned with the substrate 110.

The photo mask 65 includes a transparent substrate 66 and an opaque light blocking film 67, and the mask is divided into light transmitting areas TA2, light blocking areas BA2, and translucent areas SA2. The light transmitting areas TA2 face the end portions 179 of the data lines 171 and portions of the drain electrodes 175, the translucent areas SA2 face areas enclosed by the gate lines 121 and the data lines 171 and portions that are disposed around the light transmitting areas TA2 facing the end portions 179, and the light blocking areas BA2 face the remaining portions.

The photoresist 70 is exposed to light through the photo mask 65 and developed to remove the hatched portions of the photoresist 70.

Figure 21B:
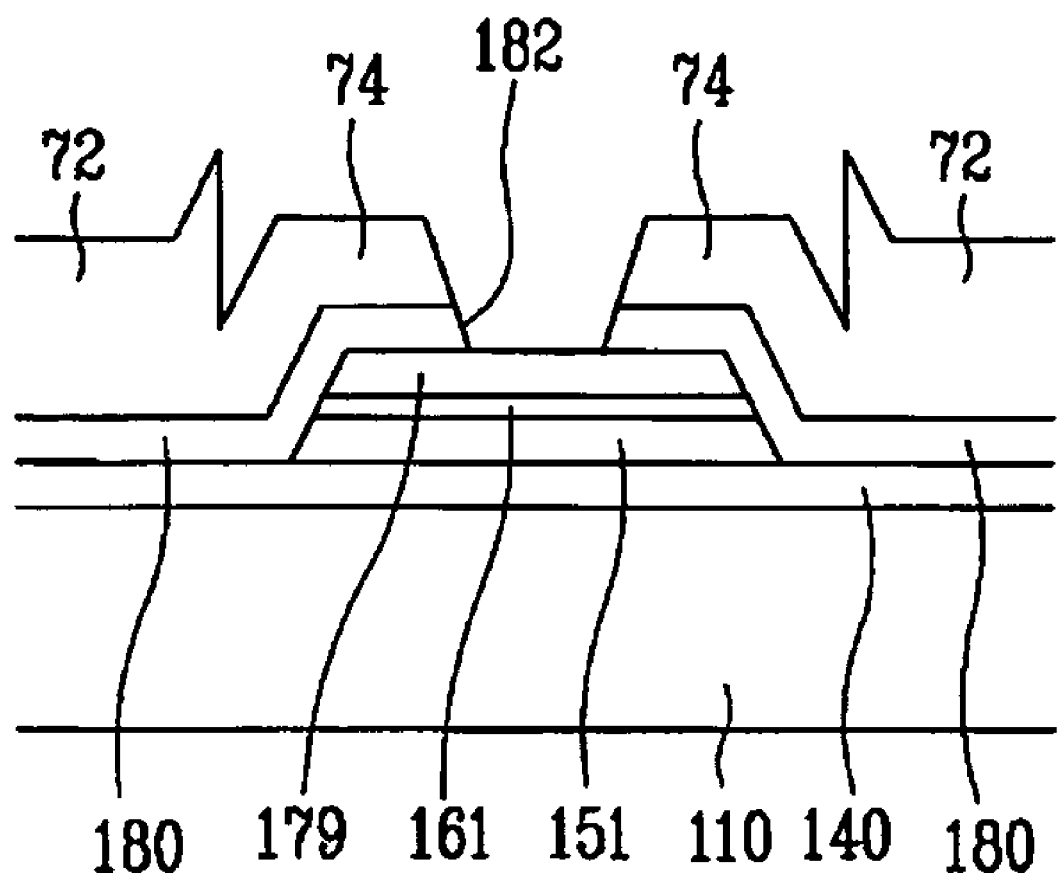
FIG. 21B, FIG. 22B and FIG. 23B are sectional views of the TFT array panel shown taken along line XXIB–XXIB' of FIG. 20.
Figure 22A:
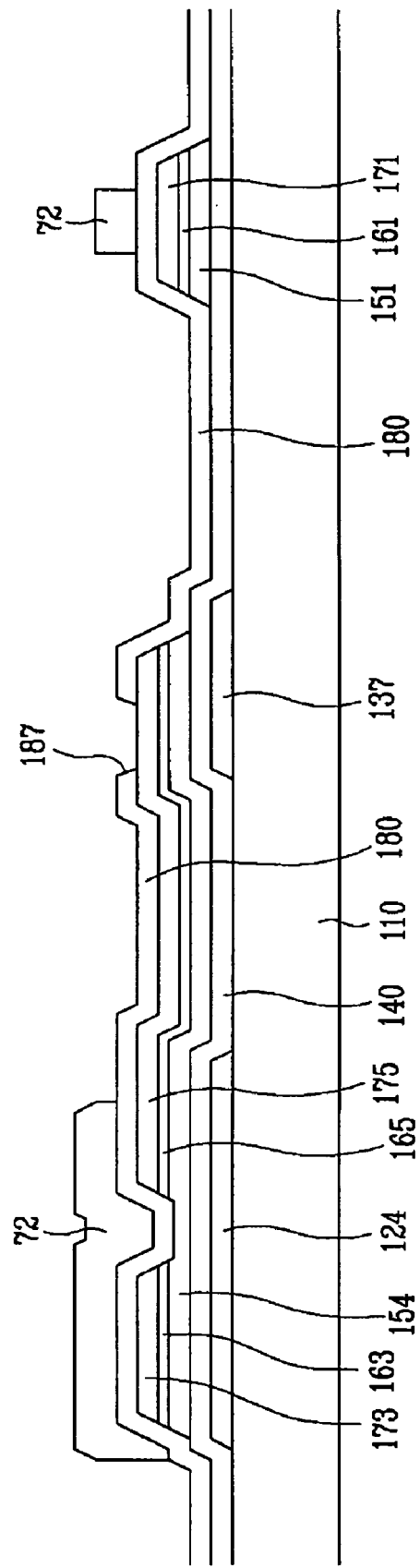

Referring to FIG. 20, FIG. 21A and FIG. 21B, the passivation layer 180 is etched, using the remaining portions 72 and 74 of the photoresist 70 as an etch mask, to form a plurality of contact holes 182 and 187 exposing the end portions 179 of the data lines 171 and portions of the drain electrodes 175, respectively.

Figure 22B:
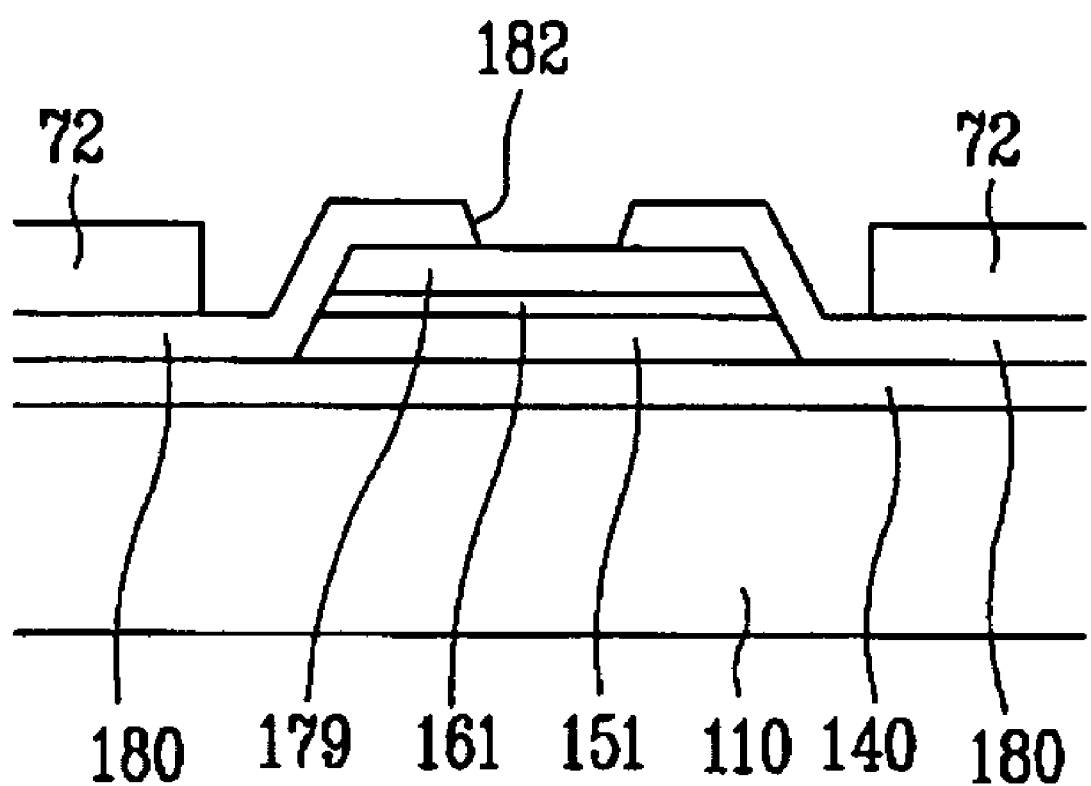
Figure 23A:
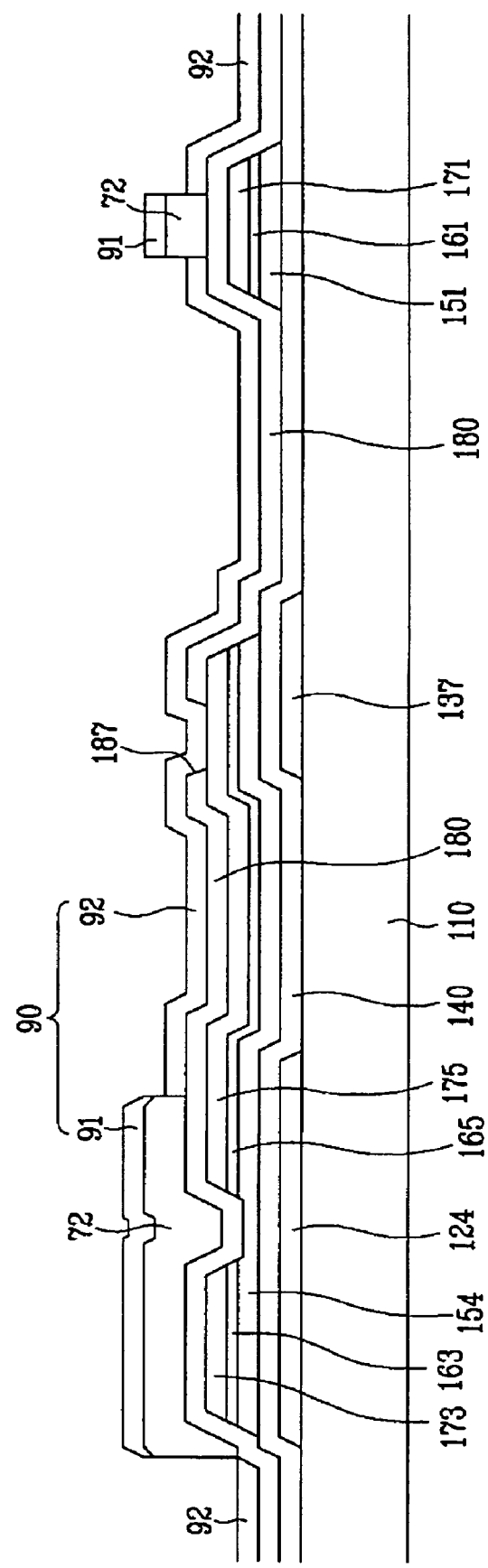

Referring to FIG. 22A and FIG. 22B, the thin portions 74 of the photoresist 70 may be removed by ashing, etc., and the thickness of the thick portions 72 is decreased.

Figure 23B:
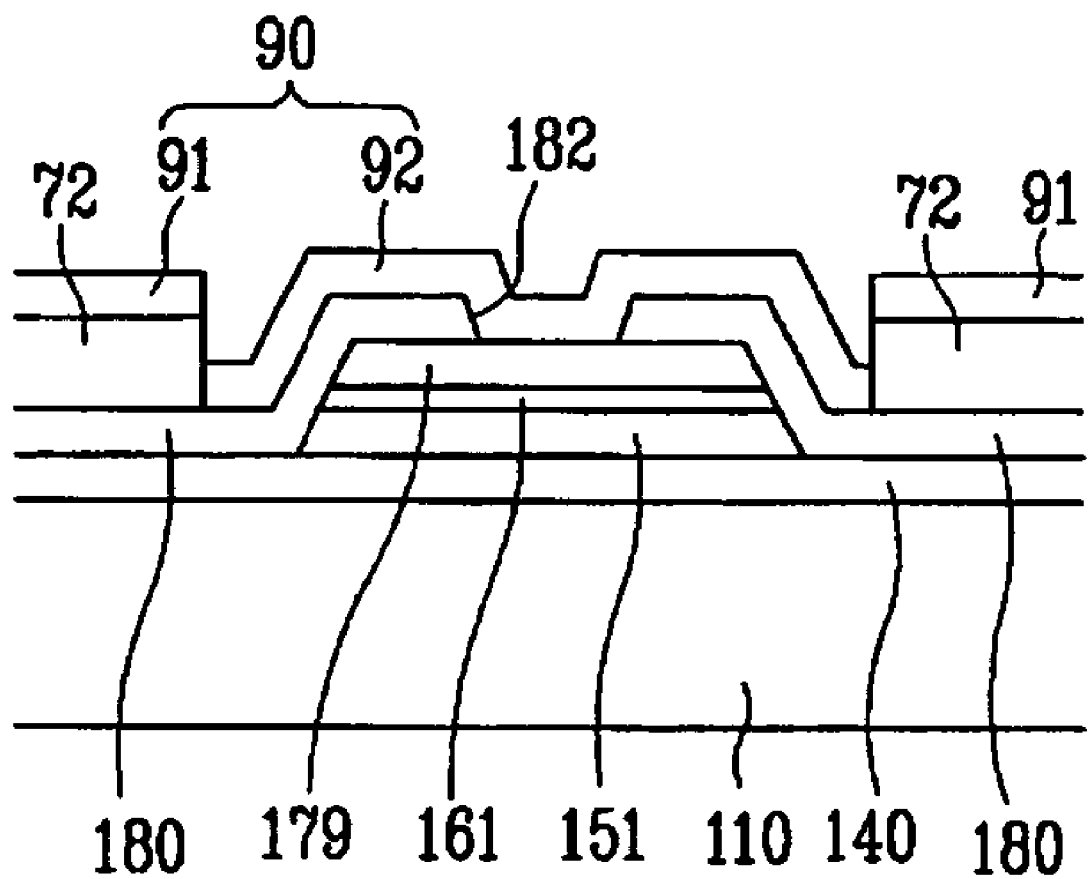

Referring to FIG. 23A and FIG. 23B, a conductive film 90 includes first portions 91 disposed on the photoresist 72 and remaining second portions 92. The photoresist 72 and the conductive film's first portions 91 may be removed to form a plurality of pixel electrodes 190 and a plurality of contact assistants 82, as shown in FIG. 13, FIG. 14A and FIG. 14B.

Since the manufacturing method of the TFT array panel according to an exemplary embodiment simultaneously forms the data lines 171, the drain electrodes 175, the semiconductors 151, and the ohmic contacts 161 and 165 using a lithography step and omits a lithography step for forming the pixel electrodes 190 and the contact assistants 82, the manufacturing process may be simplified.

Many of the above-described features of the TFT array panel and the manufacturing method thereof shown in FIGS. 1–12B may be appropriate to the TFT array panel and the manufacturing method thereof shown in FIGS. 13–23B.

As described above, the pixel electrodes and the contact holes coupling the drain electrodes with the pixel electrodes may be formed using one lithography step. Accordingly, a lithography step for forming the pixel electrodes may be omitted, thereby simplifying the manufacturing method and reducing the manufacturing time and cost.

The present invention may be employed to various display devices including LCDs and OLEDs.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor array panel, comprising:
    forming a gate line on a substrate;
    forming a gate insulating layer on the gate line;
    forming a semiconductor layer on the gate insulating layer;
    forming a data line and a drain electrode on the semiconductor layer;
    depositing a passivation layer on the data line and the drain electrode;
    forming on the passivation layer a photoresist including a first portion and a second portion;
    etching the passivation layer using the photoresist as a mask to expose a portion of the drain electrode;
    removing the second portion of the photoresist;
    depositing a conductive film; and
    removing the photoresist to form a pixel electrode,
    wherein the second portion of the photoresist is thinner than the first portion of the photoresist.

2. The method of claim 1, wherein:
    the conductive film includes a first portion and a second portion,
    the first portion of the conductive film is disposed on the first portion of the photoresist, and
    removing the photoresist removes the first portion of the conductive film.

3. The method of claim 2, wherein the photoresist is formed by using a photo mask comprising a light blocking area, a translucent area, and a light transmitting area.

4. The method of claim 2, wherein the first portion of the photoresist is reduced in thickness when removing the second portion of the photoresist.

5. The method of claim 4, wherein removal of the second portion of the photoresist comprises ashing.

6. The method of claim 2, wherein etching the passivation layer exposes a portion of the data line, and removing the photoresist forms a first contact assistant on the exposed portion of the data line.

7. The method of claim 6,
    wherein etching the passivation layer comprises etching the gate insulating layer to expose a portion of the gate line, and
    wherein removing the photoresist forms a second contact assistant on the exposed portion of the gate line.

8. The method of claim 7, wherein the first contact assistant and the second contact assistant have edges substantially coinciding with edges of the exposed portion of the data line and edges of the exposed portion of the gate line, respectively.

9. The method of claim 1, wherein the semiconductor layer, the data line, and the drain electrode are formed by one lithography step.

10. A method for manufacturing a thin film transistor array panel, comprising:
    forming a gate line on a substrate;
    forming a gate insulating layer on the gate line;
    forming a semiconductor layer on the gate insulating layer;
    forming a data line and a drain electrode on the semiconductor layer;
    depositing a passivation layer on the data line and the drain electrode;

forming a photoresist on the passivation layer and including a first portion and a second portion;
etching a layer using the photoresist as a mask to expose a portion of the data line or a portion of the gate line;
removing the second portion of the photoresist;
depositing a conductive film; and
removing the photoresist to form a contact assistant on the exposed portion of the data line or on the exposed portion of the gate line,
wherein the second portion of the photoresist is thinner than the first portion of the photoresist.

11. The method of claim 10, wherein etching the layer comprises etching the passivation layer, and removing the photoresist forms the contact assistant on the exposed portion of the data line.

12. The method of claim 10, wherein etching the layer comprises etching the passivation layer and the gate insulating layer, and removing the photoresist forms the contact assistant on the exposed portion of the gate line.

13. The method of claim 10, wherein:
the conductive film includes a first portion and a second portion,
the first portion of the conductive film is disposed on the first portion of the photoresist, and
removing the photoresist removes the first portion of the conductive film.

14. A method for manufacturing a thin film transistor array panel, the method comprising:
forming a gate line on a substrate;
forming a gate insulating layer on the gate line;
forming a semiconductor layer on the gate insulating layer;
forming a data line and a drain electrode on the semiconductor layer;
depositing a passivation layer on the data line and the drain electrode;
forming a first photoresist;
etching the passivation layer using the first photoresist as a mask to form a first contact hole exposing a portion of the drain electrode and to expose a portion of the gate insulating layer on a portion of the gate line;
transforming the first photoresist into a second photoresist;
etching the passivation layer and the gate insulating layer using the second photoresist as a mask to form a second contact hole and a third contact hole exposing a portion of the gate line and a portion of the data line, respectively;
depositing a conductive film; and
removing the second photoresist to form a pixel electrode.

15. The method of claim 14, wherein:
the conductive film includes a first portion and a second portion,
the first portion of the conductive film is disposed on the second photoresist, and
removing the second photoresist removes the first portion of the conductive film.

16. The method of claim 15, wherein the first photoresist is formed by using a photo mask comprising a light blocking area, a translucent area, and a light transmitting areas.

17. The method of claim 15, wherein removal of the second photoresist comprises ashing.

18. The method of claim 15, wherein removing the second photoresist forms a contact assistant on the exposed portions of the gate line and the data line.

19. The method of claim 15, wherein the semiconductor layer, the data line, and the drain electrode are formed by one lithography step.

20. A method for manufacturing a thin film transistor array panel, comprising:
forming a gate line on a substrate;
forming a gate insulating layer on the gate line;
forming a semiconductor layer on the gate insulating layer;
forming a data line and a drain electrode on the semiconductor layer;
depositing a passivation layer on the data line and the drain electrode;
forming on the passivation layer a photoresist including a first portion and a second portion;
etching the passivation layer using the photoresist as a mask to expose a portion of the drain electrode;
removing the second portion of the photoresist;
depositing a conductive film to form a pixel electrode; and
removing the first portion of the photoresist,
wherein the second portion of the photoresist is thinner than the first portion of the photoresist.

* * * * *